(12) United States Patent
Hopperdietzel

(10) Patent No.: US 10,224,722 B2
(45) Date of Patent: Mar. 5, 2019

(54) DEVICE FOR SWITCHING A SEMICONDUCTOR-BASED SWITCH AND SENSOR FOR DETECTING A CURRENT CHANGE VELOCITY AT A SEMICONDUCTOR-BASED SWITCH

(71) Applicant: Fraunhofer-Gesellschaft zur Foerderung der angewandten Forschung e.V., Munich (DE)

(72) Inventor: René Hopperdietzel, Nuremberg (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 239 days.

(21) Appl. No.: 15/331,694

(22) Filed: Oct. 21, 2016

(65) Prior Publication Data
US 2017/0040802 A1 Feb. 9, 2017

Related U.S. Application Data

(63) Continuation of application No. PCT/EP2015/058187, filed on Apr. 15, 2015.

(30) Foreign Application Priority Data

Apr. 24, 2014 (EP) .................................... 14165895
Jul. 22, 2014 (DE) ........................ 10 2014 214 252

(51) Int. Cl.
*H02J 4/00* (2006.01)
*G01R 19/14* (2006.01)
(Continued)

(52) U.S. Cl.
CPC ................ *H02J 4/00* (2013.01); *G01R 15/18* (2013.01); *G01R 15/183* (2013.01); *G01R 19/12* (2013.01);
(Continued)

(58) Field of Classification Search
None
See application file for complete search history.

(56) References Cited

U.S. PATENT DOCUMENTS

| 5,440,260 A | 8/1995 | Hayashi et al. |
| 7,746,153 B1 | 6/2010 | Megaw et al. |

(Continued)

FOREIGN PATENT DOCUMENTS

| DE | 102013015723 B3 | 9/2014 |
| EP | 0817381 A2 | 1/1998 |

(Continued)

OTHER PUBLICATIONS

Lao et al., "Design of a Low Swing Power-Efficient Output Stage for DC-DC Converters", Tencon 2009, IEEE Region 10 Conference, Piscataway, NJ, Jan. 23, 2009, pp. 1-6.

(Continued)

*Primary Examiner* — Daniel Kessie
*Assistant Examiner* — Swarna N Chowdhuri
(74) *Attorney, Agent, or Firm* — Perkins Coie; Michael Glenn

(57) ABSTRACT

A device for switching a semiconductor-based switch includes a terminal that is configured to be connected to a control terminal of the semiconductor-based switch. A controllable activation voltage source is configured to provide a time-varying activation voltage potential. A controllable resistive circuit includes at least two ohmic resistances connected in parallel that are controllable such that at least three resistance values of the parallel connection result. A control device is configured to control the controllable activation voltage source and the controllable resistive circuit independently of one another. The controllable activation voltage source and the controllable resistive circuit are connected to a series connection connected to the terminal.

(Continued)

The control device is configured to control the controllable activation voltage source and the controllable resistive circuit in a time-varying manner to obtain time-varying resistance values of the controllable resistive circuit and the time-varying activation voltage potential of the controllable activation voltage source.

14 Claims, 17 Drawing Sheets

(51) Int. Cl.
*H01L 23/62* (2006.01)
*H03K 17/082* (2006.01)
*H03K 17/16* (2006.01)
*G01R 19/12* (2006.01)
*G01R 15/18* (2006.01)
*H02M 1/00* (2006.01)
*H02M 1/08* (2006.01)

(52) U.S. Cl.
CPC .............. *G01R 19/14* (2013.01); *H01L 23/62* (2013.01); *H03K 17/0822* (2013.01); *H03K 17/0828* (2013.01); *H03K 17/165* (2013.01); *H03K 17/166* (2013.01); *H03K 17/168* (2013.01); *H01L 2924/0002* (2013.01); *H02M 1/08* (2013.01); *H02M 2001/0009* (2013.01); *H03K 2217/0027* (2013.01)

(56) References Cited

U.S. PATENT DOCUMENTS

| | | |
|---|---|---|
| 2003/0075748 A1 | 4/2003 | Furuie et al. |
| 2009/0066402 A1 | 3/2009 | Hiyama et al. |
| 2010/0194381 A1 | 8/2010 | Ito et al. |
| 2010/0259234 A1 | 10/2010 | Megaw et al. |
| 2012/0068691 A1 | 3/2012 | Ejury et al. |
| 2012/0299624 A1 | 11/2012 | Sugahara et al. |
| 2013/0009671 A1 | 1/2013 | Suzuki et al. |
| 2013/0278190 A1* | 10/2013 | Fink .................... B60L 11/1866 318/400.3 |
| 2014/0091643 A1 | 4/2014 | Norling |
| 2015/0030134 A1 | 1/2015 | Mrusek |
| 2017/0019051 A1* | 1/2017 | Fujie ......................... H02J 1/00 |

FOREIGN PATENT DOCUMENTS

| | | |
|---|---|---|
| EP | 1414143 A2 | 4/2004 |
| JP | H10247718 A | 9/1998 |
| WO | 2013144742 A1 | 10/2013 |
| WO | 2015039733 A1 | 3/2015 |

OTHER PUBLICATIONS

Lobsiger, Y. et al., "Decentralized Active Gate Control for Current Balancing of Parallel Connected IGBT Modules", Proceedings of the 14th IEEE International Power Electronics and Motion Control Conference (ECCE Europe 2011), Aug. 2011, pp. 1-10.

Wang et al., "Switching Performance Improvement of IGBT Modules Using an Active Gate Driver", Applied Power Electronics Conference and Exposition, Twenty-Eighth Annual IEEE, Mar. 17, 2013, pp. 1266-1273.

Zhao, L et al., "Planar Embedded Pick-Up Coil Sensor for Integrated Power Electronics Modules", 2004 IEEE Applied Power Electronics Conference and Exposition, APEC 04, IEEE, Anaheim, CA, USA, vol. 2, Feb. 2004, pp. 945-951.

Ziegler, S. et al., "Current Sensing Techniques: A Review", IEEE Sensors Journal, IEEE Service Center, New York, NY., vol. 9, No. 4, Apr. 2009, pp. 354-376.

* cited by examiner

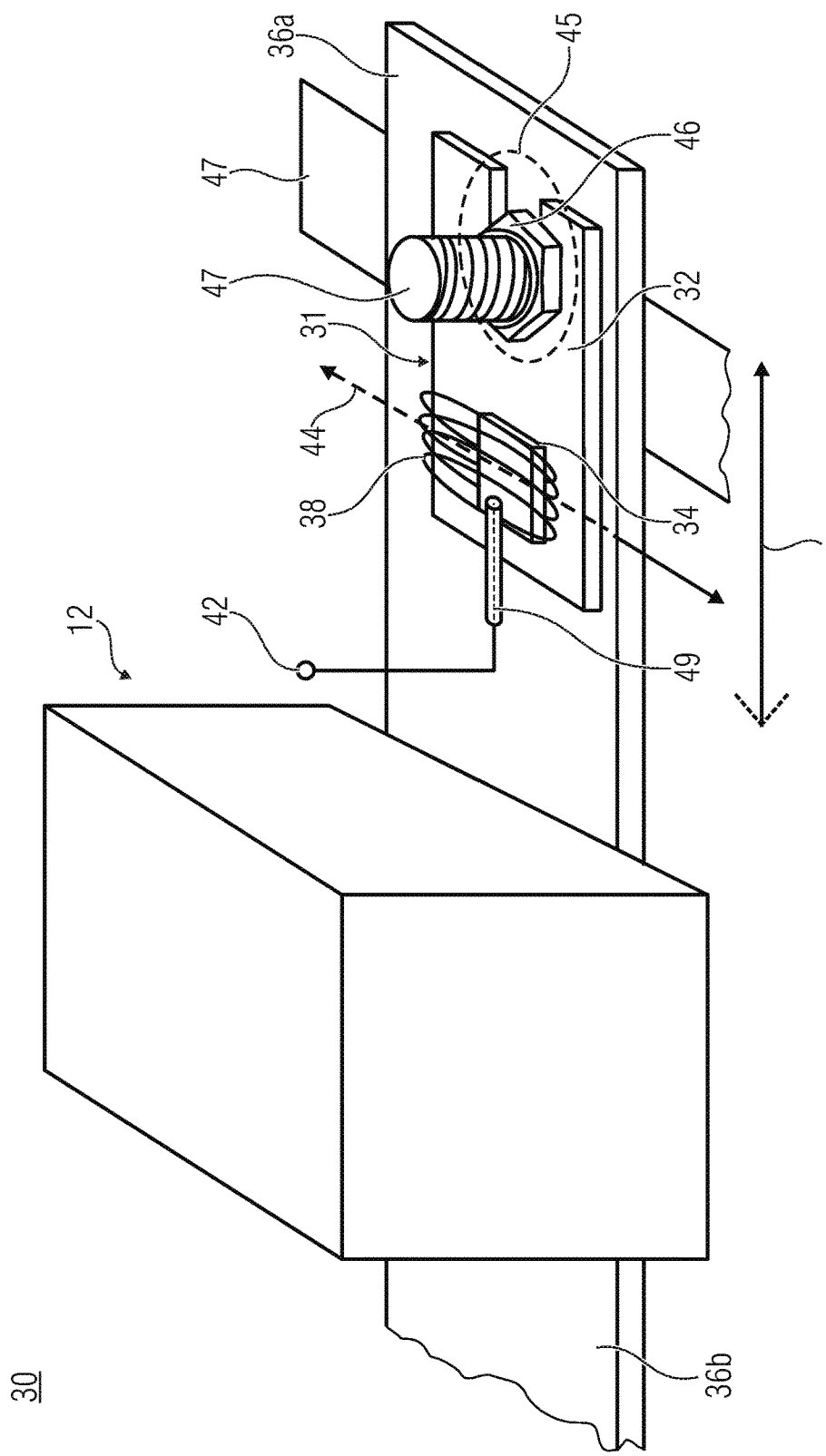

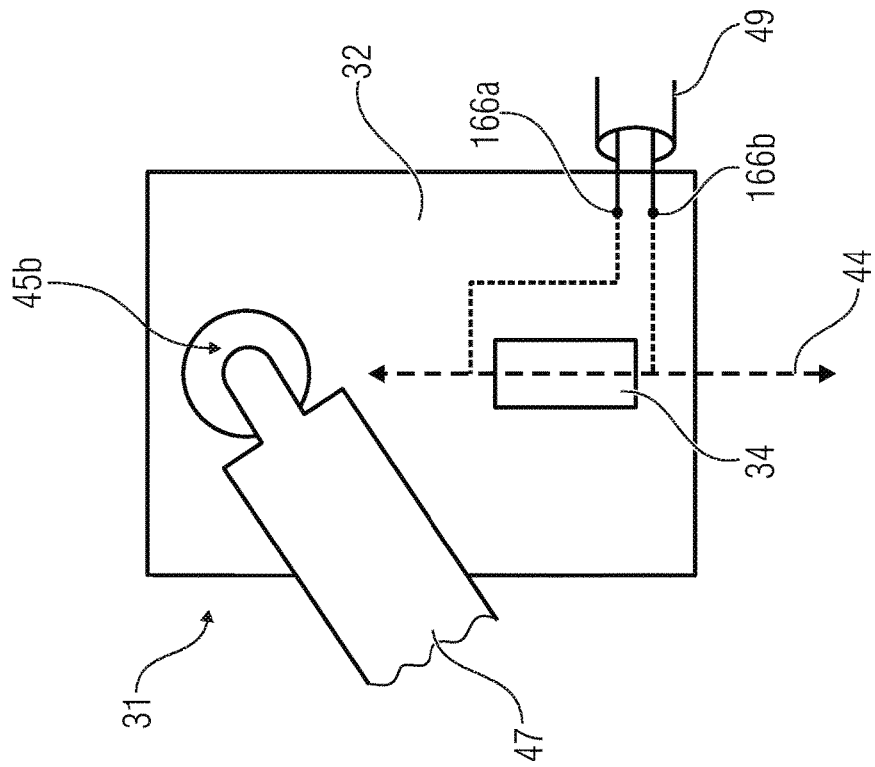
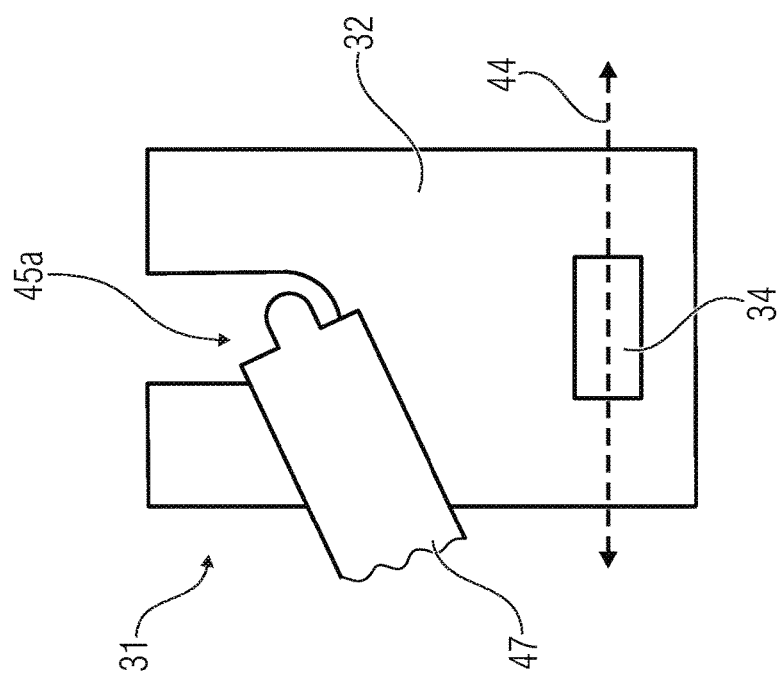

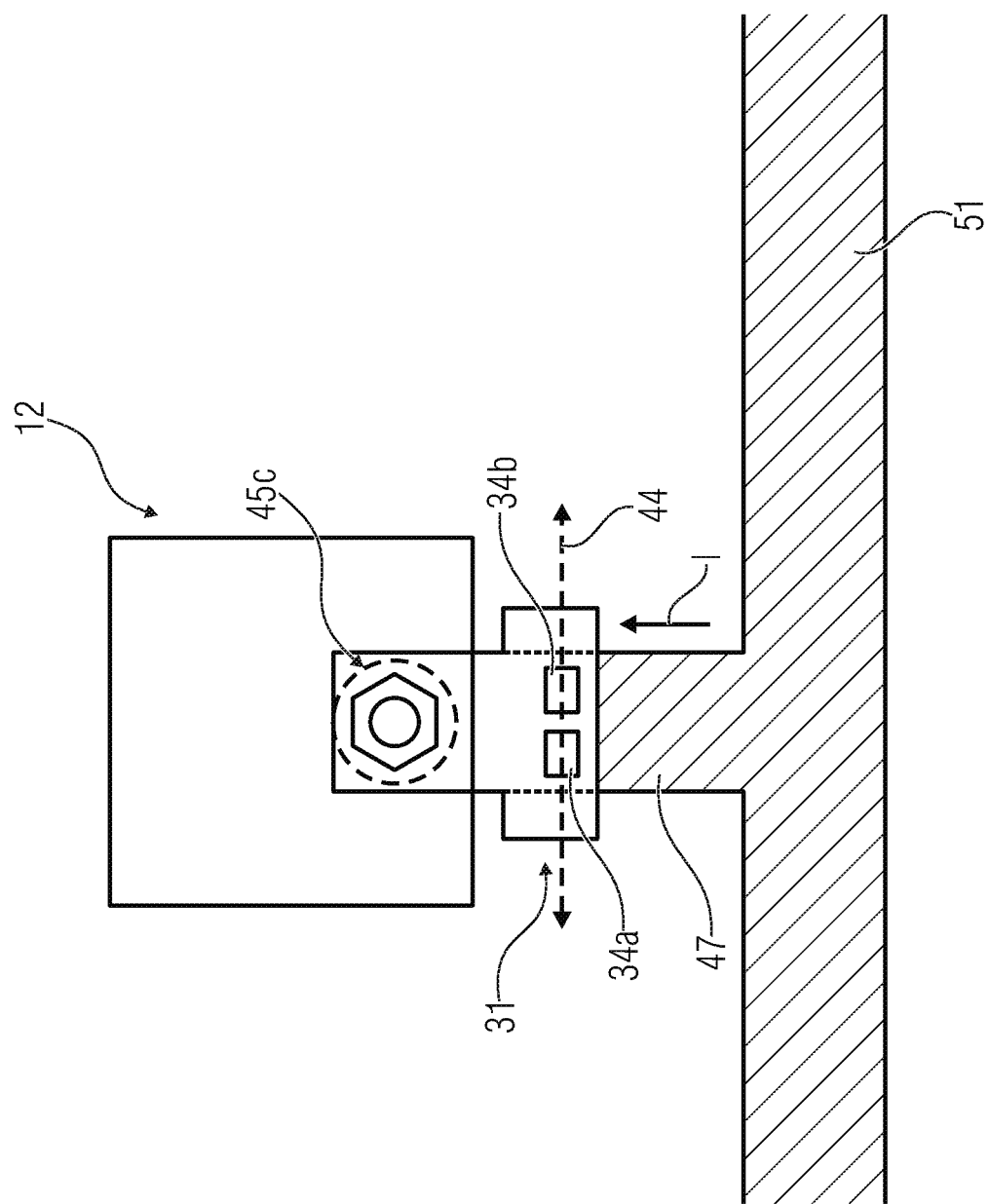

DEVICE FOR SWITCHING A SEMICONDUCTOR-BASED SWITCH AND SENSOR FOR DETECTING A CURRENT CHANGE VELOCITY AT A SEMICONDUCTOR-BASED SWITCH

CROSS-REFERENCE TO RELATED APPLICATIONS

This application is a continuation of copending International Application No. PCT/EP2015/058187, filed Apr. 15, 2015, which is incorporated herein in its entirety by this reference thereto, which claims priority from European Application No. 14165895.5, filed Apr. 24, 2014, and from German Application 10 2014 214 252.0, filed Jul. 22, 2014, which are each incorporated herein in its entirety by this reference thereto.

The present invention relates to devices for switching a semiconductor-based switch and to a sensor for detecting a current change velocity of a power current flowing through a semiconductor-based switch.

BACKGROUND OF THE INVENTION

Nowadays, so-called power converters are used for converting electric energy. The same allow the connection of energy sources with given voltages, currents and frequencies to energy sinks or loads. Here, the converter converts electric energy of one form, such as alternating current (AC), direct current (DC) or a mixed form thereof into a different form, in a single or multiple stages. Generally, the converter consists of semiconductor-based switches connected in the necessitated topology, for example as H bridge inverter or as 3-phase 6-pulse inverter. The most frequently used electronic switches are insulated gate bipolar transistors (IGBT) or metal oxide semiconductor field effect transistors (MOSFET). These semiconductor switches are controlled via so-called gate drivers and hence represent the interface between the power switch and the small-signal main control of the converter.

The requirements for such a gate driving unit (GDU) are the following: small installation space (usually determined by the form factor of the power switch package), sufficient driving power (when activating or deactivating the switches, extreme pulse energies are necessitated for reliable switching), ensuring small switching losses of the power switches (switching losses are frequently the main focus when optimizing converters), ensuring small conduction losses of the power switches, little effort for driver adaptations when using new or different power switches (plug and play), flexible scalable GDU for different applications (reusability, avoiding design variations), short death or delay time in the signal path of the converter control, high configurable degree of protection and/or interference radiation conforming to standards in any operating point if possible.

FIG. 10 illustrates the standard topology of a GDU with its functional blocks. Switching on a semiconductor-based switch 12 is performed by means of a voltage source $V_{On}$ and a transmission factor k1. Thereby, a gate current $I_{Gon}$ is induced. Switching off is performed with a voltage sink $V_{off}$ and the transmission factor k2. Thereby, the gate current $I_{Goff}$ is induced. In the error case "overcurrent", an alternative switch-off path is used via the transmission factor k2 by which a gate current $I_{Goff,err}$ is induced. This enables small installation space, ensuring low conduction losses in the power switch 12, inexpensive production and a basic degree of protection.

It is a disadvantage of such an implementation that the driving power is not optimal for each switching time/operating time, that the switching losses can only be optimized for one operating point (voltage, load current, temperature). Further, a tradeoff has to be found between short death/delay time and di/dt behavior, du/dt behavior as well as power losses in the tail phase. Further, it is disadvantageous that the switching sequence does not compensate any component leakages, that high effort is necessitated when using new or different power switches for changing the topology or for adapting the switching behavior by component changes, that no flexible adaptation or scalability is given as well as no high or no configurable degree of protection is possible. Interference radiation conforming to standard heavily influences the losses and is not suitable for a partial load at the switch 12.

The topology in FIG. 10 is also described as single-stage resistively controlled or as GDU resistive with SoftTurnOff.

FIG. 11 shows a basic structure of a single-stage/multi-stage analog-controlled GDU with active change of the gate dropping resistor. Here, two and up to, for example, a maximum of eight switching stages are useful for switching on as well as switching off the semiconductor-based switch 12. Mostly, two or three stages are known. Switching on is performed with one voltage source $V_{On}$ each and the transmission factors k1,1 ... k,n.

Thereby, the gate current $I_{Gon,x}$ is induced in different paths with x=1, ... , n. Controlling the sequence can be performed directly by the superordinate control instance. Alternatively, the control can be performed with a configured time control on the GDU.

Switching off is performed with a voltage sink $V_{Off}$ and the transmission factors k2,1 ... k2,n. Thereby, the gate current $I_{Goff,x}$ is induced with x=1, ... , n. The sequence can be performed directly by the superordinate control instance. Alternatively, the sequence can be performed with a configured time control on the GDU. In the error case "overcurrent", an alternative switch-off path via the transmission factor k3 is used. This offers the advantage of improved adaptation of the driving power for each switching time, improved optimization between short death/delay time, di/dt behavior, du/dt behavior and power losses in the tail phase, reduced impact on the power losses with interference radiation conforming to standards, ensuring small conduction losses in the power switch as well as a basic degree of protection. In other words, FIG. 11 shows a GDU having variable gate resistors.

Disadvantages of such an embodiment are an increased need for components, a more complex sequence control as well as additional (galvanically isolated) control channels. This results in increased costs. Further, it is disadvantageous that switching losses can be optimized only for one operating point (voltage, load current, temperature), that the switching sequence does not compensate any component leakages, that high effort results when using new/different power switches, that no flexible adaptation/scalability of the circuit is possible, that no high or even configurable degree of protection can be obtained. Due to lack of feedback, switching sequence drift is possible.

FIG. 12 shows a basic structure of a GDU having two voltage levels. Generally, this can be referred to as GDU having multiple voltage levels. Two voltage levels each are documented for switching on and switching off the semiconductor-based switch 12. Switching on is performed starting with a voltage source $V_{On2}$ and reduced gate current $I_{Gon}$. Then, switching to voltage source $V_{On1}$ and maximum gate current $I_{Gon}$ follows. Controlling the sequence can be performed directly by the superordinate control instance. Alternatively, the sequence can be performed with a configured time control on the GDU. Switching off takes place starting with a voltage sink $V_{Off2}$ and reduced gate current $I_{Goff}$. Then, switching to the voltage sink $V_{Off1}$ and maximum gate current $I_{Goff}$ follows. The sequence can be performed directly by the superordinate control instance. Alternatively, the sequence can be performed with a configured time control on the GDU. In the error case "overcurrent", an alternative switch-off path via the transmission factor k3 is used.

This provides the advantage of improved adaptation of the driving power for each switching time, improved optimization between short death/delay time, di/dt behavior, du/dt behavior and power losses in the tail phase. Further, interference radiation conforming to standards can be obtained, which influences the switching losses to a lesser degree. Lower conduction losses in the power switch can be ensured and a basic degree of protection can be obtained.

It is a disadvantage that increased need for components, more complex sequence control as well as additional (galvanically isolated) control channels result which result in increased costs. Switching losses can only be optimized for one operating point (voltage, load current, temperature). Further, the switching sequence does not compensate any component leakages. A high effort results when using new/different power switches, no flexible adaptation/scalability of the system is possible, and no high or even configurable degree of protection can be obtained. Switching sequence drift due to lack of feedback can occur. Implementing a second voltage level causes additional losses, depending on the realization.

FIG. 13 shows the basic structure of a single-stage/multi-stage analog-controlled GDU. Different documented extension levels exist for this principle. However, all of them are based on returning the collector potential/drain potential for detecting the duc/dt and dud/dt, respectively (derivative drain voltage over time) as well the voltage of the module-internal leakage inductance between auxiliary emitter/source and load emitter/source as a measure for dic/dt (derivative collector current over time) and did/dt, respectively (derivative drain current over time). Switching on is generally performed via a voltage source $V_{On}$ and the base resistor (impedance) k1. Thereby, the gate current $I_{Gon}$ is induced. Depending on the implementation, in the switching edge, reduction of the gate current follows during the di/dt phase and a rise/reduction during the du/dt phase. Switching off is generally performed by a voltage source $V_{Off}$ and the base impedance k2. Thereby, the gate current $I_{Goff}$ is induced. Depending on the embodiment, in the switching edge, reduction of the gate current follows during the di/dt phase and a rise/reduction during the du/dt phase. In the error case "overcurrent", an alternative switch-off path via the impedance k3 is used.

This enables better adaptation of the driving power for each switching point/operating point and good optimization between short death/delay time, di/dt behavior, du/dt behavior and power losses in the tail phase. Interference radiation conforming to standards influences switching losses to a lesser extent. Further, low conduction losses in the power conductor can be ensured. The concept offers a basic degree of protection and good adaptation to components (i.e., power switches) and edge parameter changes by feedback signals.

The disadvantages of this concept are that a significantly increased need for components results, mostly expensive analog components having a high bandwidth are necessitated, increased losses occur in the GDU by components having a high bandwidth, that feedback circuits cause additional losses due to intervention, that increased costs occur, that switching losses can only be optimized for one operating point (voltage, load current, temperature), that the switching sequence does not compensate any component leakages, that high effort results when using new/different power switches, that no flexible adaptation or scalability of the concept is possible, that merely a configurable but no high degree of protection can be obtained, that a high voltage potential (collector) necessitates installation space on a driver area, since air and creeping distances have to be considered, that high voltage components have great leakages, that no adaptation of the control plane is possible by interventions of the feedbacks, that the usage of the measured parasitic leakage inductance of the power switch is no precisely specified characteristic of the power switch itself, that with small leakage inductances no direct processing of the signal is possible and that the direct intervention with feedback comprises a phase shift such that the intervention, depending on the impedances in the gate line, only has a limited or no effect in fast switching processes and can result in undesirable oscillations.

FIG. 14 shows an embodiment of a single-stage/multi-stage digitally controlled GDU. The same serves to synchronize parallel power switches. With the help of a di/dt sensor, the beginning of the current rise (current change) during switching on as well as the beginning of the current drop during switching off is detected. Differences between switching on start and switching off start are stored and processed with further data in a DSP instance (DSP=digital signal processor). Thereby, delays for the respective switch-on time and switch-off time are determined for the next switching time and transmitted to the FPGA (FPGA=Field Programmable Gate Array).

This concept offers, among others, the advantages that low conduction losses in the power switch are ensured, that a basic degree of protection can be obtained, that a good adaption to the component and edge parameter changes by feedback signals are enabled, that good symmetry of the switching edges is enabled, that no additional losses occur by direct intervention of the feedback circuits in the gate current, that good adaptation of the switching time to component leakages of the power switches is enabled and that module-independent detection of the current change velocity di/dt is possible.

The disadvantages of this concept are a significantly increased need for components due to two programmable instances, that mostly expensive analog components having a high bandwidth are necessitated, that increased losses occur in the GDU due to two programmable instances, that increased costs can result when using high-performance DSP and/or FPGA, that no optimization of the actual switching edge curve is necessitated/possible, that switching losses can only be optimized for one operating point (voltage, load current, temperature), that the switching sequence does not compensate any component leakages, that a high effort results when using new/different power switches, that no flexible adaptation/scalability is possible and that merely a configurable but no high degree of protection can be obtained.

FIG. 15 shows a further embodiment of a digital control. In this embodiment stage, up to n=7 purely resistive switch-on paths as well as up to n=7 purely resistive switch-off paths are implemented. Via a configuration, a desired operational sequence is programmed into the FPGA. Additionally, further operating parameters, such as intermediate circuit voltage, maximum collector current, switching frequency, IGBT type and power partial topology are stored. They all serve to configure the protective functions. The protective functions include two-stage di/dt detection and four-stage voltage collector emitter VCE detection. Switching on is performed by means of a time controlled state machine activating the configured resistive switching-on paths one after the other. The VCE and di/dt states are merely processed for short circuit and desaturation monitoring.

Switching off is also performed in a time-controlled manner via timing via the configured resistive switch-off paths.

Advantages of the concept are ensuring low conduction losses in the power switch 12, a high configurable degree of protection, a low hardware change effort for driver adaptations when using new/different power switches in terms of plug and play, a flexible scalable GDU for different applications as well as optimization of the actual switching edge curve for (but only one) operating point (voltage, load current, temperature).

However, it is a disadvantage of this concept that a significantly increased need for components results by a total of 14 switching paths, wherein also significantly increased costs result by 14 switching paths. The concept has poor efficiency as never all paths are used at any time. Further, great space requirements result due to a plurality of control paths and feedback paths. The usage of the parasitic leakage inductance of the power switch is no specifically specified characteristic of the power switch resulting in measurement inaccuracies. The concept necessitates signal processing of the leakage inductance due to the low signal amplitudes. The usage of high-performance DSP and FPGA results in increased costs when implementing the concept. Thus, the switching losses can merely be optimized for one operating point (voltage, load current, temperature). Further, the switching sequence does not compensate any component leakage.

There are further digital approaches, which essentially allow a configuration of different resistive switch-on and switch-off paths, also during runtime.

A further approach includes a completely closed control loop with digital control core. Detecting the data is performed with fast analog components and subsequent digitalization. The digitized data are processed in the computer core, and again analogized by means of a digital-to-analog converter (DAC) in order to be passed on to the output stages as control information. Here, the main problem is the delay due to the signal processing times. Thus, directly intervening into the dynamic switching behavior is only possible with very slow edge curves.

In summary, the main problem of all controlled methods, independent of whether the same are analog or digital is the lack of adaptation to the operating point of the power unit. Optimization can only take place for one or a few operating points. Some component leakages and parameter variances of the power switches cannot be compensated.

All analog-controlled methods have the problem, as long as they have direct influence on the current switching edge, that they necessitate very expensive energy-hungry components having a high bandwidth resulting in a low energy efficiency. The intervention is performed by inverse feedback into the gate output stage. Thus, additional control losses are generated.

In the di/dt control by means of leakage inductance between auxiliary emitter/source and load emitter/source, great deviations exist of this parameter of the power module that is not specified in detail and/or not guaranteed. Additionally, a ground loop is interspersed. Since the leakage inductance is generally very small and continuously optimized, no direct processing can be performed.

Returning and processing the auxiliary collector/drain potential for protective functions and/or a du/dt control necessitates usage of components having high electric strength, frequently even in a cascaded manner. The same are mostly expensive and frequently too inaccurate for signal processing since the same are not operated in the optimum operating point. Apart from that, looping-in this potential results in a large unused installation area due to the necessitated voltage clearances.

Further, the approach of analog control loops is only developed and qualified for one topology/application for exactly one power switch. Adapting the topology to other or second source switches (second source is, for example, a switch of another producer identical in design) with slightly amended characteristics necessitates a hardware variation of the topology and hence a new design of the topology.

The problem of known digitally controlled solutions is also the lack of independent adaptation to the current operating point or the component leakage. Merely several resistive paths can be selected and used. Unused paths represent unused areas and still cause component costs since the same are populated.

SUMMARY

According to an embodiment, a device for switching a semiconductor-based switch may have: a terminal configured to be connected to a control terminal of the semiconductor-based switch; a controllable activation voltage source configured to provide a time-varying activation voltage potential; a controllable resistive circuit including at least two ohmic resistances connected in parallel, which are controllable such that at least three resistance values of the parallel connection result; and a control device configured to control the controllable activation voltage source and the controllable resistive circuit independently of one another; wherein the controllable activation voltage source and the controllable resistive circuit are connected in a series connection that is connected to the terminal; and wherein the control device is configured to control the controllable activation voltage source and the controllable resistive circuit in a time-varying manner in order to obtain time-varying resistance values of the controllable resistive circuit and the time-varying activation voltage potential of the controllable activation voltage source, such that a time-varying voltage potential based on the time-varying resistance values and the time-varying activation voltage potential can be applied to the control terminal.

According to a first aspect of embodiments described below, an efficient and compact device is provided that is configured to apply a plurality of voltage and resistance values to a control terminal of a semiconductor-based switch with a switch-on path or activation path for switching on (activating) a semiconductor-based switch. The plurality of voltage and resistance values provides an advantageous concept for exactly controlling the semiconductor-based switch. Using a switch-on path allows compact realization of the concept. It is an advantage of this concept that by using a switching path (and hence a reduced number), a plurality of voltage values and/or resistance values can be set and the transmission parameter of the path can be changed dynamically.

A device for switching a semiconductor-based switch according to the first aspect includes a controllable activation voltage source that is configured to provide a time-varying voltage potential. The controllable activation voltage source is connected to a controllable resistive circuit in a series connection. The controllable resistive circuit comprises at least two ohmic resistances connected in parallel controlled such that at least three resistance values of the parallel connection result. A control device of the device is configured to control the controllable activation voltage source and the controllable resistive circuit independent of one another, such that based on time-varying resistance values and time-varying voltages, a time-varying voltage potential is obtained that is applied to a control terminal of a power switch via a circuit path.

According to a second aspect of embodiments described below, an efficiency of a gate driver is increased in that charge carriers removed from a control capacitance, such as an insulated gate of an IGBT, during a switching process are used for operating the control device and are hence recycled. It is an advantage of the second aspect that by using the charge carriers for operating the control device, switching losses are reduced and the operation can be made more energy-efficient.

A device according to the second aspect includes a terminal that is configured to be connected to a control terminal such as a gate terminal of a semiconductor-based switch. Further, the device comprises a controllable deactivation voltage source that is configured to provide, at least temporarily a switching potential at a potential node connected to the terminal and a control device that is configured to control the controllable deactivation voltage source accordingly. The switching potential is galvanically coupled to a supply node to which a supply potential of the control device is coupled and has a lower potential value than a threshold voltage of the semiconductor-based switch. The control device is configured to control the controllable deactivation voltage source such that, based on the provided switching potential, charge carriers flow out of the control capacitance and contribute to an operation of the control device based on the galvanic coupling.

According to a third aspect of embodiments described below, a concept for contactless detection of a switching state of the semiconductor-based switch is provided, which provides precise detection of a current change velocity of a power current flowing through a semiconductor-based switch.

An electric circuit according to third aspect includes a semiconductor-based switch with a first terminal and a second terminal for conducting a power current and a sensor for detecting a current change velocity of the power current. The sensor includes an insulating foil that is configured to be connected to the first or second terminal of the semiconductor-based switch and an inductance arranged on the insulating foil on a side of the same that is arranged opposite to a side facing the semiconductor-based switch during a measurement operation of the sensor. The inductance is configured to detect the magnetic field generated by the power current and to provide a measurement voltage based on the detected magnetic field. The inductance is spaced apart from the semiconductor-based switch during the measurement operation at least by the insulating foil, such that contactless measurement of the current change velocity by the sensor is enabled. The insulating foil comprises a mounting portion that is connected to the first or second terminal of the semiconductor-based switch.

The insulating foil allows contactless detection of the power current such that high voltage safety is obtained. Further, the detection is very accurate since an inductance value of the inductance is exactly determined. Further, by means of an adjustable distance and/or an adjustable orientation between inductance and current-carrying elements, a measurement voltage of the sensor can be precisely adjusted.

Embodiments of the invention will be discussed in more detail below. In the figures, the same or equal elements are provided with the same reference numbers.

Embodiments of the three aspects can be combined with another and allow a mutual advantageous further development of the respective aspect.

BRIEF DESCRIPTION OF THE DRAWINGS

Embodiments of the present invention will be detailed subsequently referring to the appended drawings, in which:

FIG. 3 is a schematic perspective view of an electric circuit with the semiconductor-based switch and a sensor for detecting a current change velocity of a power current flowing through the semiconductor-based switch according to the third aspect;

FIG. 4a is a schematic top view of the sensor, where an insulating foil includes a mounting portion comprising an open recess;

FIG. 4b is a schematic top view of the sensor, where a mounting portion includes a recess implemented in the form of a hole (closed recess);

FIG. 4c is a schematic top view of the sensor, where the insulating foil comprises a mounting portion and where the current conductor is part of intermediate circuit rails;

DETAILED DESCRIPTION OF THE INVENTION

Figure 1:
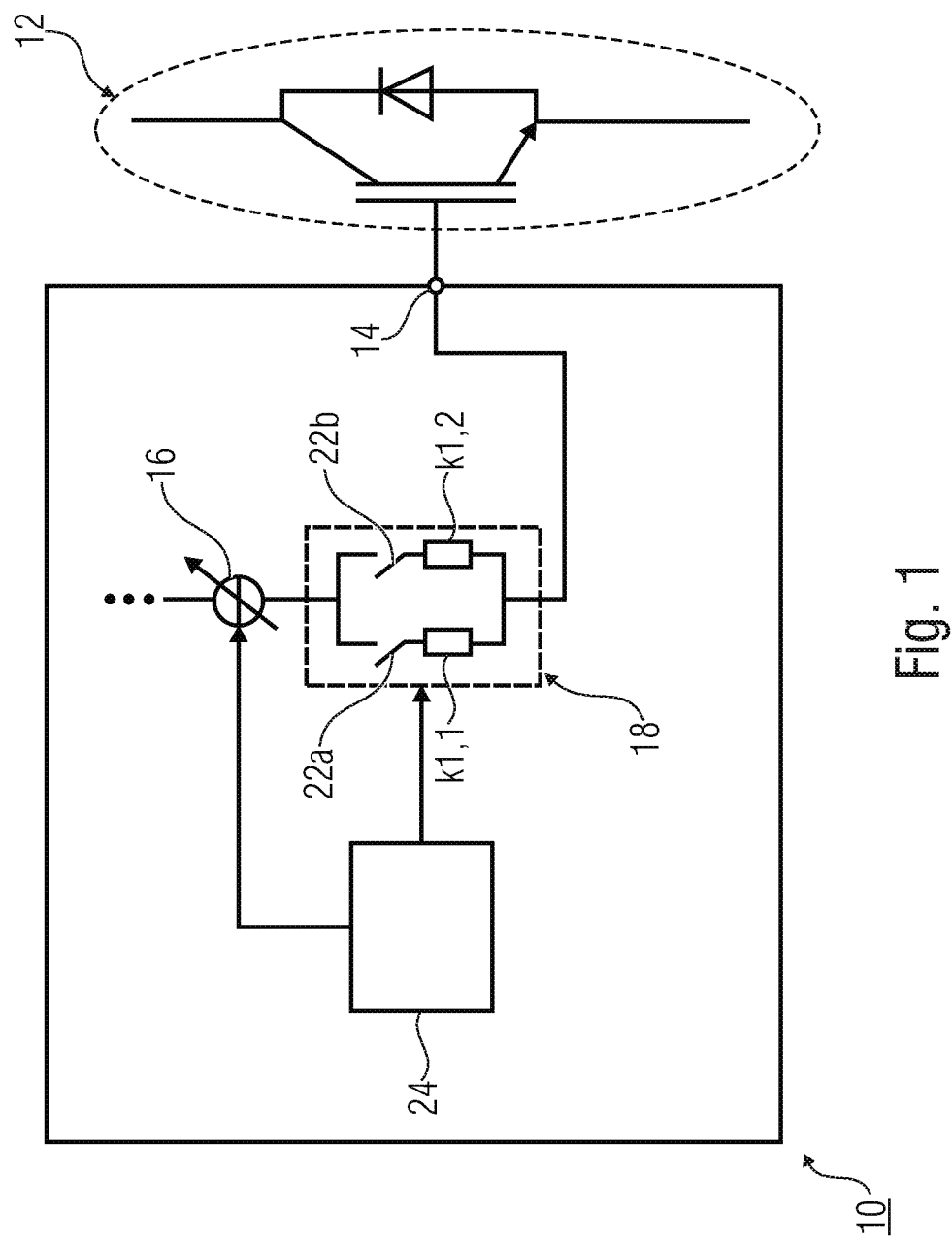
FIG. 1 is a schematic block diagram of a device for switching a semiconductor-based switch according to the first aspect.

Before embodiments of the present invention will be discussed in more detail below based on the drawings, it should be noted that identical, functionally equal or equal elements, objects and/or structures in the different figures are provided with the same reference numbers, such that the description of these elements illustrated in the different embodiments is inter-exchangeable or inter-applicable.

Embodiments describe below relate to switching a semiconductor-based switch, such as a metal oxide semiconductor field effect transistor (MOSFET) or an insulated gate bipolar transistor (IGBT).

The semiconductor-based switch can be of an n channel or p channel type. Further, the semiconductor-based switch can have a normally conductive or normally non-conductive configuration. Based on a concentration of charge carriers stored on a control capacitance (gate capacitance) connected to the control terminal of the semiconductor-based switch (gate terminal), a switch state, for example conductive or non-conductive, can be changed.

Thus, the control terminal of the semiconductor-based switch can be, for example, a gate terminal of a MOSFET. Alternatively, the control terminal can be the terminal of an insulated gate electrode of an IGBT or a different controllable semiconductor-based switch.

For improved clarity, the semiconductor-based switch will be described below such that the semiconductor-based switch is in a non-conductive state (i.e., non-conducting or only slightly conducting) when the concentration of charge carriers in the control capacitance is so low that a control potential or a control voltage at the control terminal is below a threshold value of the switch (deactivated state). If the concentration of charge carriers has a higher value, such that the control voltage is above the threshold, the semiconductor-based switch is in a conductive state (activated state). It is obvious that these states can be interchanged based on the configuration of the semiconductor-based switch, for example normally conductive/normally non-conductive. When dynamically switching the switch, a Miller-induced re-bias (reactivation) of the semiconductor-based switch can occur, such that in this case a change to the activated state is enabled when a control voltage is greater than a Miller voltage of the semiconductor-based switch that is greater than the threshold voltage. Changing into the deactivated state is enabled when the control voltage is lower than the threshold voltage.

Supplying charge carries to the control capacitance for switching a semiconductor-based switch into an active state will be referred to as activation below. Discharging charge carriers from the control capacitance for switching the semiconductor-based switch to the deactivated state is referred to as deactivation. When the semiconductor-based switch is in an inhibited, i.e., non-conductive state, the same can be converted i.e. switched to the conductive or non-conductive state by supplying or discharging charge carriers to or from the control terminal.

FIG. 1 shows a schematic block diagram of a device 10 for switching a semiconductor-based switch 12 according to the first aspect. The device 10 includes a terminal 14 that is configured to be connected to a control terminal of the semiconductor-based switch 12 and a controllable activation voltage source 16 that is configured to provide electric voltage and charge carriers resulting, in a control capacitance of the semiconductor-based switch 12, in a control voltage and an active state of the semiconductor-based switch when the control voltage is greater than or equal to a threshold voltage of the same. The device 10 includes a controllable resistive circuit 18 including at least two ohmic resistances k1,1 and k1,2 connected in parallel. Based on the parallel connection, the two ohmic resistances k1,1 and k1,2 can be switched such that four resistance values of the controllable resistive circuit result. For this, the controllable resistive circuit 18 has a controllable switch 22a that is connected in series into a circuit path with the ohmic resistance k1,1. The series connection is connected to the terminal 14 and forms an activation path. Further, the controllable resistive circuit 18 has a second controllable switch 22b which is connected in series into a circuit path with the ohmic resistance k1,2. The two circuit paths are connected into a parallel connection.

In a first state of the controllable resistive circuit 18, for example, the controllable switches 22a and 22b are each in a closed state, so that both ohmic resistances k1,1 and k1,2 are effective in the controllable resistive circuit 18. In a second or third state, for example, either the controllable switch 22a or the controllable switch 22b is in the closed state and the respective other controllable switch 22b or 22a in an open state, such that either the ohmic resistance k1,1 or k1,2 is effective in the controllable resistive circuit 18. In a fourth state of the controllable resistive circuit 18, the controllable switches 22a and 22b are, for example, in an open state, such that both circuit paths are interrupted and the controllable resistive circuit 18 has a high, up to possible infinitely high, resistance value, i.e., the ohmic resistances k1,1 and k1,2 are ineffective.

The device 10 includes a control device 24 that is configured to control the controllable activator voltage source 16 and the controllable resistive circuit 18 independent of one another in a time-varying manner. The control device 24 is, for example, configured to set states of the controllable switches 22a and/or 22b in a time-varying manner. The controllable switches 22a and/or 22b can be implemented as transistors.

This allows that starting from the controllable activation voltage source 16 up to the terminal 14 merely one path can be implemented (wired) on a circuit, for example a printed circuit board in order to obtain the functionality of variable voltages and variable resistance values. This means that implementation (wiring) of several paths between which switching is performed can be prevented and merely one path can be arranged which is used at all times.

The independent control of the controllable activation voltage source 16 and the controllable resistive circuit 18 allows a high degree of freedom when configuring a switch on or switch-off path since, as compared to hard-wired paths, both the voltage and the effective ohmic resistance can be varied independent of one another.

Further, the control device 24 is configured to set an output voltage of the controllable activation voltage source 16. The output voltage of the controllable activation voltage source 16 can, for example, include a voltage range of greater than or equal to $-100$ V and less than or equal to $+100$ V, greater than or equal to $-10$ V and less than or equal to $+10$ V or a range of greater than or equal to 0 V and less than or equal to 5 V.

The controllable activation voltage source is connected in series to the controllable resistive circuit 18 into a series connection. Based on the time-varying control of the controllable activation voltage source 16 and time-varying resistance values of the controllable resistive circuit 18, a time-varying voltage potential can be applied to a control terminal of the semiconductor-based switch 12. This means that the time-varying voltage potential can be varied in that the control device 24 changes an output voltage of the controllable activation voltage source 16 in a time-varying manner and/or changes i.e., controls the resistance value of the controllable resistive circuit 18 in a time-varying manner.

An amount of charge carriers that are supplied per time unit to the control terminal or away from the control terminal and hence a switching velocity of the semiconductor switch 12 can be set based on the voltage of the controllable activation voltage source 16 and based on the resistances k1,1 and k1,2.

Alternatively, the controllable resistive circuit 18 can also be configured such that one of the ohmic resistances k1,1 or k1,2 is effective and thus a first or second state of the resistance values can be set. Based on a control of the respective different switch 22b and/or 22a, a third state of the controllable resistive circuit 18 can be set, this means the two ohmic resistances k1,1 and k1,2 connected in parallel can be controlled such that three resistance values result. Alternatively, the third state can also be obtained when both ohmic resistances k1,1 and k1,2 are inactive. Alternatively, the controllable switches 22a and 22b could also be controllable in the sense of logic OR-operation, such at least one of the ohmic resistances k1,1 or k1,2 or both of them are effective (energized), such that the two ohmic resistances k1,1 and k1,2 can be controlled such that three resistance values result. One of the resistance values of the ohmic resistances k1,1 or k1,2 can be configured, concerning its resistance value, with regard to a desired current change velocity (di/dt) during the switching phase. The respective different ohmic resistance k1,2 or k1,1 can be configured, with respect to its resistance value with regard to a desired voltage change (du/dt) at a load path of the semiconductor-based switch 12. The voltage change relates, for example, to a changed voltage drop between a collector and an emitter terminal (IGBT) or a changed voltage drop between a source and a drain terminal (MOSFET). The two resistances k1,1 and k1,2 can have the same or a differing value.

Alternatively, the controllable resistive circuit 18 can also comprise more than two ohmic resistances that are controlled such that three, four or more resistance values result.

While the device 10 has been described such that a switch-on behavior of the semiconductor-based switch 12 is controllable by means of the controllable activation voltage source 16 and the controllable resistive circuit 18, the device 10 can also be used for controlling a switch-off behavior of the semiconductor-based switch 12. The controllable activation voltage source 16 can, for example, be controlled as voltage sink, for example in that the provided voltage is lower than the threshold voltage of the semiconductor-based switch 12.

This allows advantageous control of the semiconductor-based switch during a switch-on and/or switch-off phase of the semiconductor-based switch 12.

A controllable voltage source in connection with a controllable resistive circuit can additionally also be arranged in a deactivation path in order to allow exact and interference-free deactivation of the semiconductor-based switch 12. In other words, the first aspect can also be used for deactivation.

Figure 2:
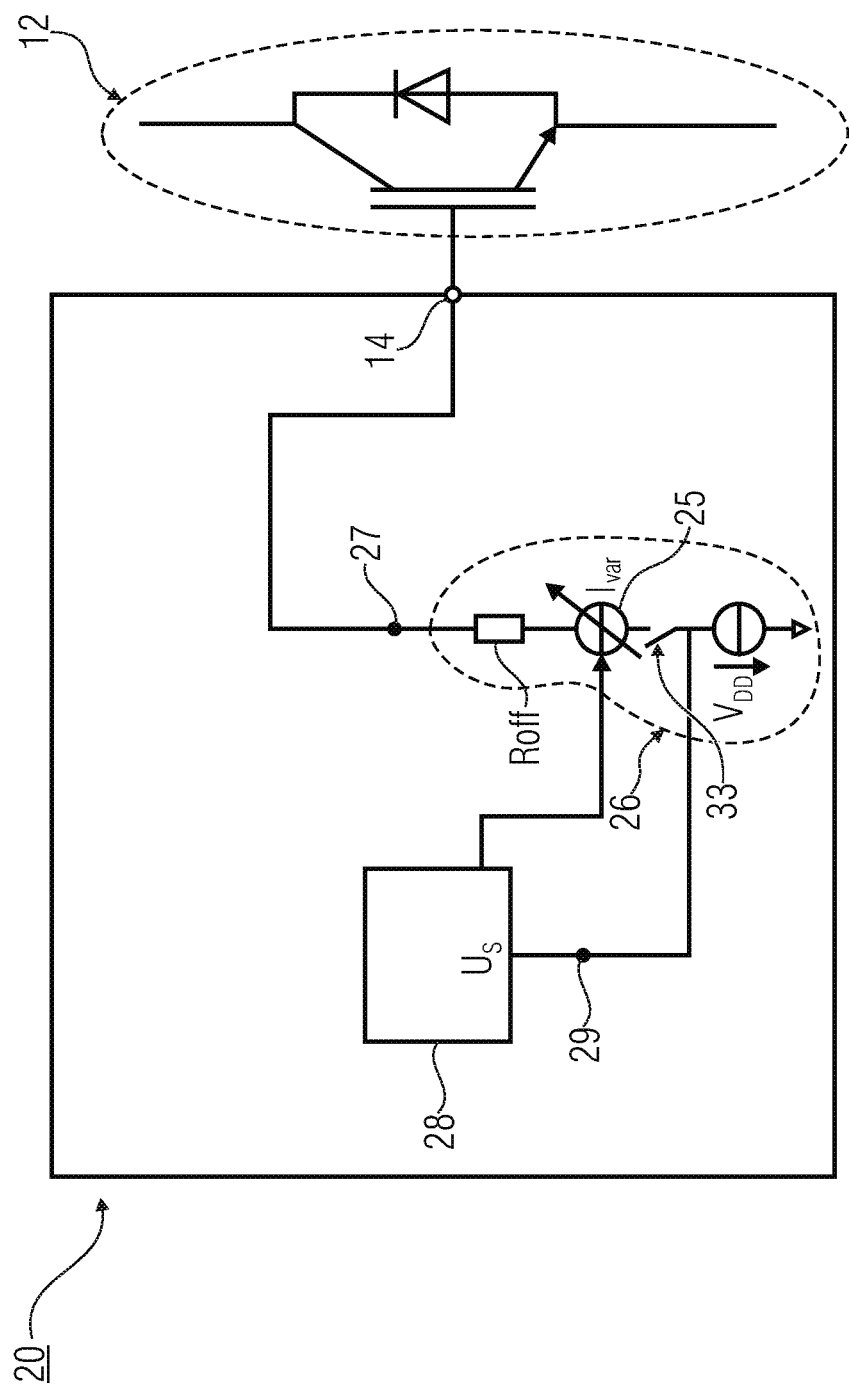
FIG. 2 is a schematic block diagram of a device for switching the semiconductor-based switch according to the second aspect.

FIG. 2 shows a schematic block diagram of a device 20 for switching the semiconductor-based switch 12 according to the second aspect. The device 20 includes the terminal 14 and a controllable deactivation voltage source 26 connected to the terminal 14 and configured to provide at least temporarily, i.e., in a time-varying manner, a switching potential $V_{DD}$ and a potential based on the switching potential $V_{DD}$, respectively, at a potential node 27. The controllable deactivation voltage source 26 forms a deactivation path.

The controllable deactivation voltage source 26 includes a controllable impedance 27 and an output resistance Roff. The controllable impedance 25 is configured to induce a variable control current $I_{var}$. Alternatively, the controllable impedance 25 can also be an output impedance of the deactivation voltage source 26. The deactivation voltage source 26 can be configured to apply a variable output current $I_{var}$ to the output resistance Roff of the controllable deactivation voltage source 26. Alternatively or additionally, the provided voltage can also be controllable and hence variable.

The controllable deactivation voltage source 26 includes a controllable switch 33 connected between the controllable impedance 25 and the supply node 29, such that, when the controllable switch 33 is in a closed state, galvanic coupling exists between a supply node 29 and the controllable impedance 25.

The device 20 includes a control device 28 that is configured to control the controllable deactivation voltage source 26 in a time-varying manner. Based on the control of the control device 28, the controllable deactivation voltage source 26 is configured to provide the switching potential $V_{DD}$ and a potential based on the switching potential $V_{DD}$, respectively, during a switching interval during which the semiconductor-based switch 12 is deactivated. The switching potential allows a discharge of charge carriers from the control capacitance of the semiconductor-based switch 12, such that the same is converted in the deactivated state. The switching potential $V_{DD}$ has a potential value that is lower than the threshold voltage of the semiconductor-based switch 12.

The switching potential $V_{DD}$ is galvanically coupled to the supply node 29 to which a supply potential $U_S$ of the control device 28 is applied when the controllable switch 33 is closed. This enables that, when the semiconductor-based switch 12 is in the active state, i.e. charge carriers are stored on or in the control capacitance and the switching potential $V_{DD}$ is applied to the terminal 14, the charge carriers can be discharged at least partly from the control capacitance in the direction of the switching potential $V_{DD}$.

Based on the galvanic coupling of the supply potential $U_S$ of the control device 28 with the switching potential $V_{DD}$, these charge carriers contribute to the operation of the control device 28. The charge carriers being discharged from the control capacitance during a switching process of the semiconductor-based switch 12 (deactivation) are used again or further which can also be referred to as recycling. Such a recovery of the control energy during switching-off allows reduction of the energy consumption of the control device 28 and hence the device 20. The reduced energy consumption results in an increased efficiency of the device 20.

Alternatively or additionally, the device 20 can additionally comprise a controllable resistive circuit, such as the controllable resistive circuit 18. The controllable resistive circuit can be connected to the controllable activation voltage source 29, for example in a series connection. The control device 28 can be configured to control the controllable resistive circuit. This allows exact control of the switching behavior of the semiconductor-based switch 12 during deactivation and activation. Further, the supply potential $U_S$ can be applied to further active circuit elements or circuit groups of the device 20, such as further circuits or amplification circuits. The same can be referred to as low voltage (LV) periphery, whereas current paths through which the power current flows can be referred to as high voltage (HV) components. In this way, the recycled charge carriers can also contribute to an operation of the LV periphery.

A combination of the second aspect with the first aspect can be performed, for example such that the second aspect, such as device 20, also comprises a controllable resistive circuit. The controllable voltage source can be realized, for example, by means of a constant voltage source or a potential that is connected to a controllable impedance in order to obtain a variable voltage value at the controllable impedance, such that the controllable impedance and the potential at least partly form the functionality of the controllable voltage source, wherein the controllable voltage source can include further components.

This can be performed as an alternative to using the first aspect as described with regard to FIG. 1.

FIG. 3 shows a schematic perspective view of an electric circuit 30 with the semiconductor-based switch 12 and a sensor 31 for detecting a current change velocity of a power current I flowing through the semiconductor-based switch 12 according to the third aspect. The sensor 31 includes an insulating foil 32. An inductance 34 is arranged on the insulating foil 32. The semiconductor-based switch 12 comprises a first power terminal 36a and a second power terminal 36b. The first power terminal 36a can, for example, be a drain terminal or a source terminal, when the semiconductor-based switch 12 is a MOSFET based switch. Alternatively, the first power terminal 36a can be a collector terminal or an emitter terminal when the semiconductor-based switch 12 is an insulated gate bipolar transistor. The second power terminal 36 can be the other terminal source and drain, respectively or emitter and collector, respectively. Alternatively, the power terminal 36a and/or 36b can also be arranged in the semiconductor-based switch and can be connected to a current conductor allowing a connection to a power supply.

If the power current I flows through the semiconductor-based switch 12, for example from the first power terminal 36a to the second power terminal 36b, the power current I will generate a magnetic field 38. The inductance 34 is configured to detect the magnetic field 38 in order to provide a measurement potential 42 based on a current change velocity dI/dt.

The inductance 34 is arranged on a side of the insulating foil 32 arranged facing away from the semiconductor-based switch 12 and a power terminal 36a or 36b of the semiconductor-based switch 12, respectively. This means that the inductance 34 is spaced apart from the semiconductor-based switch 12 at least by the insulating foil 32.

Further spacing sheets that can include insulating materials can be arranged between the insulating foil 32 and the semiconductor-based switch 12. The insulating foil 32 as well as the optional spacing sheets result in electrical insulation of the inductance 34 with respect to the semiconductor-based switch 12. A distance between the inductance 34 and the semiconductor-based switch 12 increased due to the spacing sheets can hence result in an increased electrical insulation. This has the effect that detecting the magnetic field 38 and hence detecting the current change velocity dI/dt can be performed in a contactless manner, this means that a direct, for example galvanic coupling between the semiconductor-based switch 12 and the sensor 31 can be prevented.

This results in an increased voltage security with respect to a measurement of a current change velocity based on leakage inductances arranged within the semiconductor-based switch 12. Further, the inductance 34 can have a high accuracy of the inductance value caused by a production process. This enables the omission of using leakage inductances for detecting the current change velocity in the semiconductor-based switch 12. Alternatively or additionally, by means of the spacing adjustable by the insulating foil 32 and possible spacing sheets, the amplitude of the measurement voltage 42 can be adjusted. Increasing the distance can be used for reducing the measurement voltage. Alternatively, by means of reducing the distance, for example by means of a lower foil thickness, the amplitude can be increased.

The mounting portion 45 can include, for example, a recess of the insulating foil 32. The recess can be configured such that, for example, when the first and/or second power terminal 36a and/or 36b are implemented as screw connection for connecting with a screw 46, the insulating foil 32 can be arranged between the semiconductor-based switch 12 and the screw 46 without necessitating removal of the screw 46 from the power terminal 36a and 36b, respectively. This can be performed, for example, by inserting the insulating foil 32 between the screw 46 and the semiconductor-based switch 12. A current terminal 47 can also be arranged between the screw 46 and the semiconductor-based switch 12, for example, in the form of a cable lug or other suitable means, such that when mounting the screw 46 with respect to the power terminal 36a and 36b, respectively, apart from an electrical, also a mechanical fixing of the sensor 38 and the current conductor 47 is obtained. Alternatively, the current conductor 47 can also be guided in a direction to the power terminal 36a having an angle to a surface normal of an area of the semiconductor-based switch 12 on which the power terminal 36a is arranged. The angle can be smaller than or equal to 90°. Simply put, the current conductor 47 can be led to the semiconductor-based switch 12, for example in terms of a busbar terminal. The insulating foil 32 can be arranged parallel (for example directly adjacent or arranged thereon) to the current conductor 47. This allows increased magnetomotive force of the inductance 34. Alternatively or additionally, the power terminal 36a and allocation, respectively, where the same is connected to the current conductor 47 can also have a spacing from the semiconductor-based switch, such that the magnetic field 38 has a homogeneous shape at the location of the inductance 34.

The mounting portion 45 is configured at least partly to surround the current conductor, for example, in the form of a section of the power terminal or a current conductor arranged thereon.

The inductance 34 has at least one preferential direction 44. The preferential direction 44 can, for example, be an axial direction along which turns of a coil which at least partly form the inductance 34 are arranged. A sensitivity of the inductance 34 with respect to the magnetic field 38 can be adjusted based on an orientation of the preferential direction 44 with respect to direction of the current flow I. In this way, the sensitivity can be high or even at a maximum when the preferential direction 44 is arranged perpendicular to the current flow direction 44. Alternatively, when the preferential direction 44 has a different angle to the current flow direction, a sensitivity can be lower than a maximum in order to prevent overdrive, i.e., a high or too high signal level of the measurement voltage 42.

The inductance 34 enables, for example by inductance, detection of a current change velocity of the current I. Such a detection can be highly precise compared to usage of parasitic leakage inductances in the semiconductor-based switch 12. While conventionally used leakage inductances are a possibly non-specified characteristic of the semiconductor-based switch 12, the inductance 34 can have low parameter variations, such that the measurement potential 42 enables precise evaluation of the current change velocity. The precise evaluation allows precise monitoring and/or setting a state of the semiconductor-based switch 12, for example during a switching process.

The preferential direction 44 can have a tolerance range, for example due to production reasons, where the preferential direction 44 is perpendicular to the direction of the current flow I. The tolerance range can have, for example, a value of less than or equal to ±15°, less than or equal to ±10° or less than or equal to ±5°. Alternatively, the inductance 34 can also have a second preferential direction, for example along a direction that is opposite to the preferential direction 44, for example when the inductance 34 is a symmetric coil.

The inductance 34 can have a flow concentrator that is configured to concentrate a magnetic flow of the magnetic field. The flow concentrator can, for example, be a ferrite core that is arranged as coil core with regard to the inductance 34.

The measurement voltage 42 can be transmitted, for example, via an electrically shielded transmission line, for example to a control device, for example the control device 24 or 28.

Alternatively, the inductance can also be a series connection of inductive elements, such as a series connection of several coils. The coils can have, when the same comprise a flow concentrator, a common or separate flow concentrators. The above-described aspects can be combined with one another. For example, the first aspect can be combined with the second aspect and/or the third aspect. Alternatively or additionally, the second aspect can be combined with the third aspect and/or the first aspect.

Alternatively, the first and/or second power terminal 36a and/or 36b configured to be connected to the current conductor 47 by means of a plug connection, a clamp connection, a solder connection or other mechanical means. Accordingly, the current conductor 47 can also be configured, as an alternative to the implementation with a cable lug, according to the respective mechanical connection.

The measurement voltage can be transmitted via a measurement line 49, for example a single-wire or two-wire line. The measurement line 49 can comprise a shielding that is configured to reduce electromagnetic spurious influences of the measurement voltage 42 and/or with respect to the measurement voltage 42. Alternatively or additionally, the measurement voltage can be transmitted via a twisted two-wire line.

FIG. 4a shows a schematic top view of the sensor 31, wherein the insulating foil 32 includes a mounting portion 45a comprising an open recess (open mounting portion). The recess enables that the insulating foil 32 can be arranged on the semiconductor-based switch without removing possible mounting screws. The inductance 34 has the preferential direction 44 that is arranged in an orientation parallel to the mounting portion 45a. The mounting portion 45a partly surrounds the current conductor 47.

FIG. 4b shows a schematic top view of the sensor 31, wherein a mounting portion 45b includes a recess implemented in the form of a hole (closed recess). The closed recess and the hole, respectively, can have a round, rectangular, elliptic or free-form peripheral geometry. The closed recess allows guiding of a current conductor through the mounting portion 45b, for example when the current conductor 47 is guided to the semiconductor-based switch 12 via a plug connection. If the current conductor 47 is guided through the mounting portion 45b, the mounting portion 45b surrounds the current conductor 47 completely. The insulating foil 32 comprises connecting terminals 166a and 166b that are connected to the inductance 34 and configured to provide, during operation of the sensor 31, a measurement voltage and a measurement potential to the inductance 34. The measurement line 49 can be connected to the connecting terminals 166 and 166b, for example by a mechanically fixed connection as it can be obtained by soldering or screwing.

The inductance 34 has the preferential direction 44 which is rotated with respect to the illustration in FIG. 4a, such that the preferential direction 44 is arranged in a direction (or 180° offset thereto) towards the mounting portion 45b.

FIG. 4c shows a schematic top view of the sensor 31 comprising a mounting portion 45c which is implemented as closed recess. The current conductor 47 is part of intermediate circuit rails 51 that are configured to supply the semiconductor-based switch 12 with electric energy or receive it from the same. The sensor 31 comprises the two inductances 34a and 34b that are arranged perpendicular to a direction of the current flow I with the preferential direction 44.

In the following a combination of the first aspect, the second aspect and the third aspect will be described.

Figure 5A:
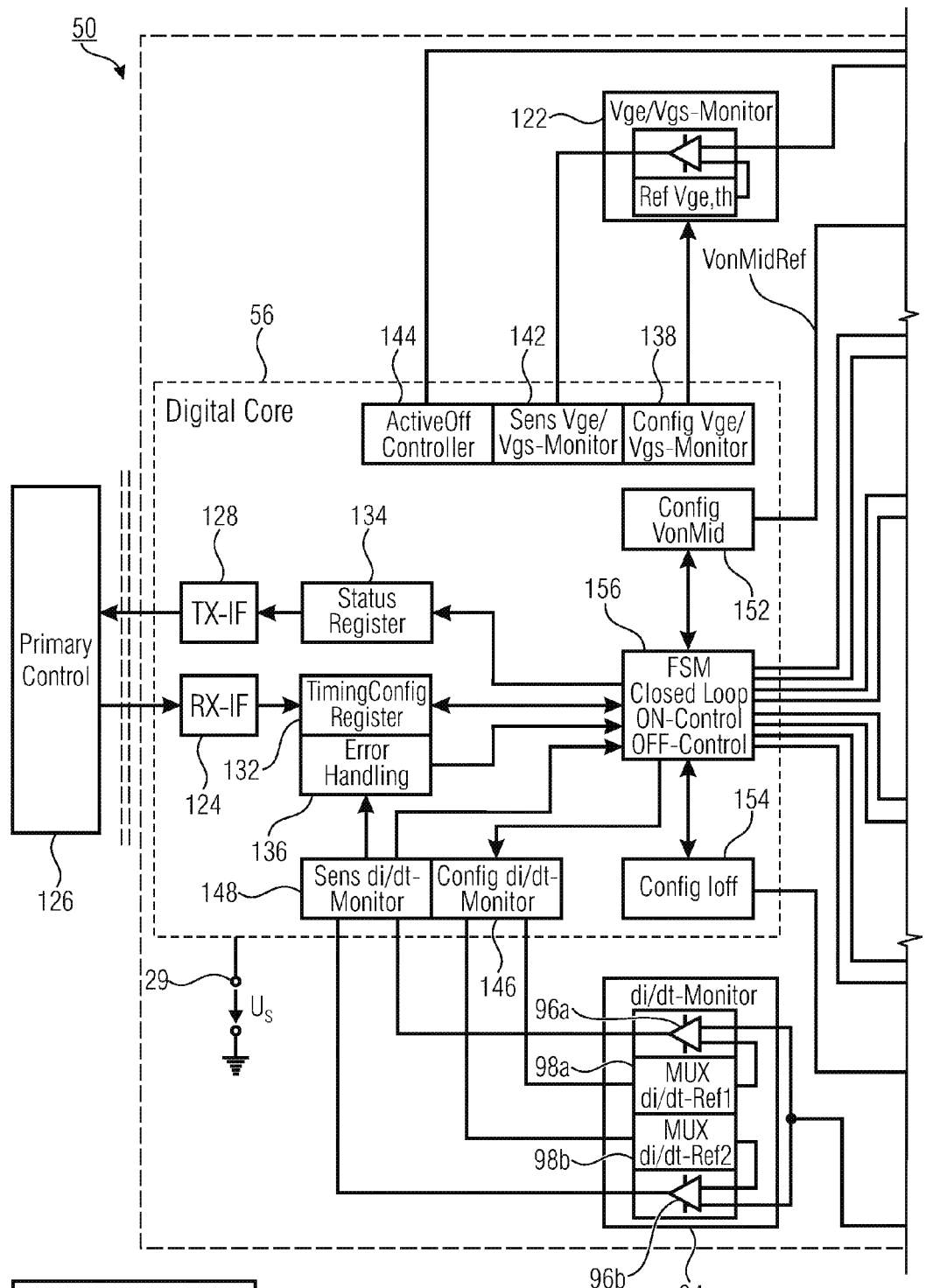
FIGS. 5a-5b is a schematic block diagram of a device comprising a combination of the first, second and third aspect and configured to control the semiconductor-based switch.
Figure 5B:
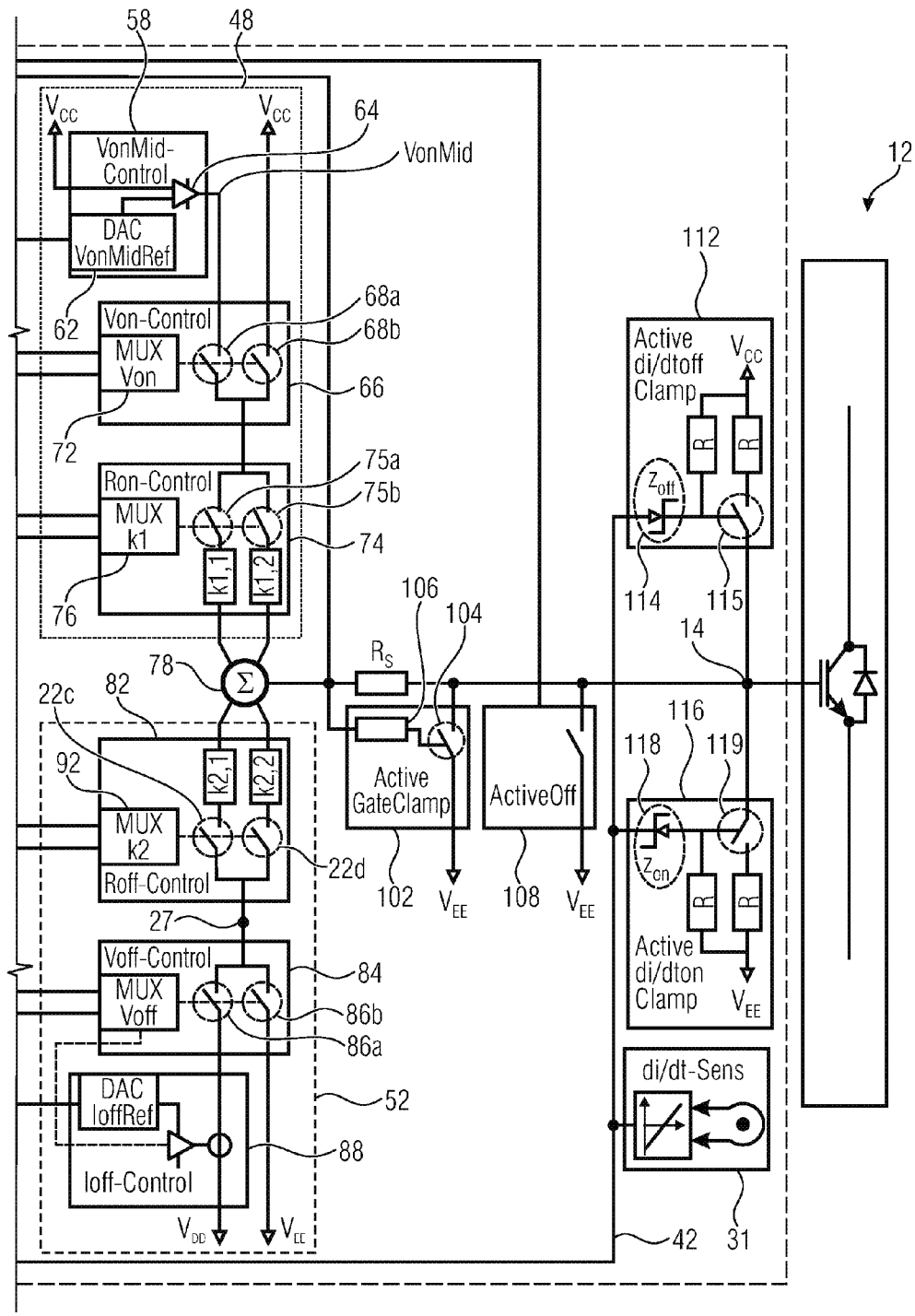

FIG. 5a and FIG. 5b show a schematic block diagram of a device 50 that is configured to control the semiconductor-based switch 12.

The device 50 comprises a controllable switch-on path (activation path) 48, a controllable switch-off path (deactivation path) 52, the sensor 31 for detecting the current change velocity of the power current flowing through the semiconductor-based switch 12 and a control device 56. The control device 56 is configured to control the activation path 48 during an activation phase of the semiconductor-based switch 12. During a deactivation phase, the control device 56 is configured to control the deactivation path 52. As discussed in detail below, the activation path 48 includes features of the first aspect. The deactivation path 52 comprises features of the first and second aspects. The sensor 31 comprises features of the third aspect.

The activation path 48 includes a controllable activation voltage source 58 referred to as functional unit "VonMid-Control". The controllable activation voltage source 58 comprises a digital to analog converter (DAC) 62 that is configured to receive a time-varying digital signal VonMidRef from the control device 56, and to convert the same into a time-varying analog signal. The controllable activation voltage source 58 further comprises a differential amplifier 64 that is configured to compare the time-varying analog signal provided by the DAC 62 with respect to a source voltage $V_{CC}$ and to amplify a difference of the two signals VonMidRef (and its analog representation, respectively) and $V_{CC}$ and in this way to provide a time-varying voltage VonMid. The controllable activation voltage source 58 is configured to provide a time-varying output voltage based on the time-varying difference. Alternatively, for example, the DAC 62 can be configured to detune a voltage regulator. The same is configured to provide the desired voltage VonMid fed from the source voltage $V_{CC}$ (and hence the maximum possible voltage).

The activation path 48 includes a controllable switch device "Von-control" 66 comprising two controllable switches 68a and 68b as well as a multiplexer "VonMux" 72.

The multiplexer 72 is configured, for example, to receive control instructions from the control device 56, to multiplex the same and to control the controllable switches 68a and 68b based on the multiplexed control signals. Alternatively, the controllable switch device 66 can also be configured to obtain a control signal with respect to one or all controllable switches 68a/68b. On the input side, the controllable switch 68a is connected to the controllable activation voltage source 58. On the input side, the controllable switch 68b is connected to the source potential $V_{CC}$. On the output side the two controllable switches 68a and 68b are connected to one another and are connected to a controllable resistive circuit 74 via a common potential connection. When the controllable switch 68a is in a closed state and the controllable switch 68b is in an open state, the variable voltage VonMid, and when the controllable switch 68a is in the open state and the controllable switch 68b is in the closed state, the source voltage $V_{CC}$ can be applied to the controllable resistive circuit 74. The source voltage can, for example, have an almost constant value of, for example, approximately 5 V or 10 V (for example, for MOSFET-based switches) or 15 V (for example, for IGBT-based switches). Basically, the source voltage $V_{CC}$ can correspond to the voltage by which the respective semiconductor-based switch is fed statically in the on-state and, hence, can also have a different value.

The controllable resistive circuit 74 includes the ohmic resistances k1,1 and k1,2 that are connected in parallel to one another as described for the controllable resistive circuit 18. Further, the controllable resistive circuit 74 comprises a multiplexer 76 that is configured to receive control signals from the control device 56 to control, based on the received control signals, controllable switches 57a and 57b of the controllable resistive circuit 74 as described for the controllable resistive circuit 18. Alternatively, the controllable resistive circuit 74 can also be configured to obtain, with respect to one or all controllable switches of the same, a control signal, i.e., the multiplexer is an optional element.

On the output side, the activation path 48 is connected to the terminal 14, wherein an ohmic resistance $R_S$ is connected between a node point 78 and the terminal 14. The activation path 48 is configured to convert i.e., to switch the semiconductor-based switch 12 from a deactivated state to an activated state (activation), based on charge carriers provided by the controllable activation voltage source 58 or the source voltage $V_{CC}$ and entering the control capacitance.

The deactivation path 52 is configured to receive, in the function of a voltage sink, charge carriers from the control capacitance of the semiconductor-based switch 12 (discharge the same) and in this way convert the semiconductor-based switch 12 in a deactivated state. This can be performed such that during the deactivated state, i.e., at an end of the switching process, a holding voltage, i.e., a static OFF voltage $V_{EE}$ is applied to the control terminal. The voltage $V_{EE}$ can have a negative potential with respect to a reference voltage, such as the emitter potential of the semiconductor-based switch 12 and/or a ground voltage (GND), such that, based on the negative potential, the control terminal can be discharged and/or biased with a negative potential.

The deactivation path 52 comprises a series connection of a controllable resistive circuit 82 and a controllable (deactivation) voltage source (Voff-Control) 84 that is configured to provide the switching potential $V_{DD}$ at the potential node 27. The deactivation path 52 is connected to the node 78 and hence to the terminal 14. The controllable voltage source 84 comprises two controllable switches 86a and 86b. At one terminal, the controllable switch 86b is connected to the static OFF voltage $V_{EE}$. The controllable switch 86a is connected to the switching potential $V_{DD}$, wherein a controllable impedance 88 is connected between the controllable switch 86a and the switching potential $V_{DD}$, which is configured to set, based on control instructions of the control device 56, a time-varying impedance between the controllable switch 86a and the switching potential $V_{DD}$.

The switching potential $V_{DD}$ is galvanically connected to a supply potential of the control device 56, such that charge carriers flowing from the control capacitance of the semiconductor-based switch 12 via the controllable resistive circuit 82 and via the controllable switch 86a to the switching potential $V_{DD}$ contribute to the operation of the control device 56. The static OFF voltage $V_{EE}$ can have a voltage value that is lower than the threshold voltage of the semiconductor-based switch 12 and/or can have a voltage value that is lower than a reference voltage, for example ground (GND), such that activation of the semiconductor-based switch 12 is prevented when the static OFF voltage $V_{EE}$ is applied to the terminal 14 via the controllable resistive circuit 82 and the controllable switch 86b. In other words, with respect to GND, the static OFF voltage $V_{EE}$ can be negative or equal to GND and can have any value between a maximum emitter voltage and 0 V.

The controllable voltage source 84 is configured to receive control instructions from a sequence control of the control device 56. Based on a control of the controllable switches 86a and 86b, the switching potential $V_{DD}$ can be applied to the potential node 27 that is connected to an input side of the controllable resistive circuit 82 when the controllable switch 86a is closed. Alternatively, when the controllable switch 86b is closed, the static OFF voltage $V_{EE}$ can be applied to the potential node 27 and to the controllable resistive circuit 82, respectively. The two controllable switches 86a and 86b are connected to one another at the terminal facing away respectively from the voltage potential $V_{DD}$ and $V_{EE}$, respectively. The potential node 27 can be any point or portion along an electric connection between the controllable deactivation voltage source 84 and the controllable resistive circuit 82. Thus, a potential applied to the potential node 27 can be switched in a time-varying manner during deactivation between the switching potential $V_{DD}$ guided via a controllable impedance (Ioff-Control) 88 and the static OFF-voltage $V_{EE}$.

The controllable resistive circuit 82 comprises two ohmic resistances k2.1 and k2.2 that are connected parallel to one another. A controllable switch 22c is connected between the ohmic resistance k2.1 and the controllable voltage source 84. A controllable switch 22d is connected between the ohmic resistance k2.2 and the variable voltage source 84, such that, based on a control of the controllable switches 22c and 22d, at least three resistance values can be set, as it is described for the controllable resistive circuit 18.

The controllable resistive circuit 82 comprises a multiplexer 92 that is configured to receive control instructions for controlling the controllable switches 22c and 22d from the control device 56. Alternatively, the controllable resistive circuit 82 can also be configured to obtain a control signal with respect to one or all controllable switches 68c/68d.

The sensor 31 is configured to provide the measurement voltage 42. A comparator circuit 94 connected between the sensor 31 and the control device 56 is configured to receive the measurement voltage 42 and to provide data signals to the control device 56 which comprising information with regard to the current change velocity, for example when switching on (activating) the semiconductor-based switch 12, the current change in the active state as well as the current drop velocity when deactivating the semiconductor-based switch. The control device 56 is configured to control the semiconductor-based switch 12 at least partly based on the measurement voltage 42. For this, the comparator circuit 94 can comprise two comparators 96a and 96b to which the measurement voltage 42 can be applied, each to a first comparative terminal. A respective second comparative terminal (input) can be connected to a variable reference potential. The variable reference potential can be provided by multiplexers 98a and 98b, respectively, that can be controlled by the control device 56. The respective data signals that are based on the comparative results are provided to the control device 56. Thus, the comparator circuit 94 is configured to compare an amplitude of the measurement voltage 42 with comparative values provided by the control device 56. The sensor 31 and/or the device 50 can further comprise a matching circuit for matching or adapting, i.e. scaling the amplitude of the measurement voltage 42, for example in the form of an attenuator.

The device 50 comprises an Active GateClamp 102 (active circuit at the control terminal for preventing Miller-induced (re) switching-on of the semiconductor-based switch 12) including a controllable switch, for example a transistor 104 connected between the terminal 14 and the static off-voltage $V_{EE}$, such when the controllable switch 104 is closed, the terminal 14 and hence the control terminal of the semiconductor-based switch 12 is connected to the static off-voltage $V_{EE}$. This enables a discharge of charge carriers from the control capacitance and prevention of exceeding the threshold voltage. Alternatively, the transistor can also be connected to a reference potential, such as 0V or ground (GND).

The controllable switch 104 is configured to be controlled based on a voltage drop of a resistor Rs connected in parallel to the controllable switch 104, wherein a lowpass filter (LPF) 106, which is configured to filter short-term voltage drops, is arranged between the (sensor) resistor Rs and a control input of the controllable switch 104. A voltage drop across the sample resistor Rs can result in closing of the controllable switch 104. In dependence on the dynamic voltage difference between the terminal 14 and the node 78, the path via the Active GateClamp 102 can have a high impedance or accordingly a low impedance. The stronger the deviation between a voltage at the terminal 14 and the node 78, the lower the impedance of the Active GateClamp, i.e. the shunt path 102, and hence counteracts a Miller-induced voltage rise. The Active GateClamp is configured to be possibly effective only during the deactivation process, such that switching on (activation) of the semiconductor-based switch 12 is prevented at these times. This enables the avoidance of Miller-induced switching-on of the semiconductor-based switch 12. The lowpass filter 108 enables that merely short disturbances, such as by switching processes of the semiconductor-based switch 12 and the like are filtered out and in that way undesired short-circuiting of the control terminal is prevented. Further, the lowpass filter 106 and the sensor resistor 104, respectively, are connected to a monitoring means (Vge/Vgs-Monitor) 122 that allows detection of the potential at terminal 14 by means of the control device 56.

A first terminal of a controllable switch (ActiveOff) 108 is connected to the terminal 14. A second terminal of the controllable switch 108 is connected to the reference potential. The control device 56 is configured to control the controllable switch 108 such that based on the control, the terminal 14 can be connected to the reference potential and the static OFF-voltage $V_{EE}$, respectively. For example, when the control voltage of the semiconductor-based switch 12 falls below a configured threshold during deactivation, the control device 56 can be configured to control the controllable switch 108 to short-circuit the control terminal. For example, a voltage level of the control voltage can be defined as such a threshold, where the switch-off process (deactivation) is terminated. This allows reducing the control voltage by further discharging the control capacitance, for example, for increasing the interference reserve of the semiconductor-based switch 12. An interference can take place, for example, by a varying voltage at the terminal 14 or the node 78, for example by electromagnetic coupling-in. At the same time, such a structure allows switching-off the semiconductor-based switch to the static OFF-voltage $V_{EE}$, such that in this case switching off is enabled by bypassing the deactivation path 52. In this case, the source voltage $V_{CC}$ can be used as inverse feedback potential. Alternatively, the controllable switch 108 can also be connected to the reference potential GND.

Further, the device 50 includes a first inverse feedback branch 112 (active di/dtoff-clamp) that is configured to limit the current steepness of the power current flowing through the switch 12 during the deactivation phase. The inverse feedback branch is connected to the measurement voltage 42 of the sensor 31 at a control input. An increased current drop velocity (current change velocity outside the control range) during a deactivation phase can result in a reduced potential value of the measurement voltage 42. For a maximum allowable and/or a desired current drop velocity lying above the set amount of the control range in normal operation, a respective threshold of the measurement voltage 42 can be determined. Based on the respective threshold, a Zener diode 114 can be designed, which is connected in the first inverse feedback path 112 between the measurement voltage 42 and a control terminal of a transistor 115.

If the current drop velocity exceeds the threshold, the output voltage of di/dt sensor 31 falls below the limit. Thereby, the Zener diode 114 becomes conductive and the inverse feedback becomes active by means of a conductive state of the transistor 115. This means that the switching potential $V_{CC}$ is applied to the terminal 14 via an ohmic resistance R. Thus, the current drop at the control terminal of the semiconductor-based switch 12 can be reduced by feeding in a control current (gate current) of the active di/dtoff-clamp, such that the current drop velocity falls. In other words, the di/dtoff-clamp consists of a transistor with a resistor R connected with respect to the voltage source $V_{CC}$ of the driver output stage. The di/dt sensor 31 serves as control source. Hence, the transistor 115 can be referred to as limit switch for limiting the current change velocity during the deactivation process.

Further, the device 50 comprises a second inverse feedback branch (active di/dton-clamp) 116 that is configured to limit a current change velocity, for example during the activation phase. During an error case, for example in the case of an error in the sequence control of the control device 56 or error cases in the load circuit of the power switch, i.e. the semiconductor-based switch 12, resulting in current change velocities significantly above the defined set value, the inverse feedback branch 116 is configured to limit the current steepness as inverse feedback branch. Contrary to the normal control (control in normal case) this takes place in a lossy manner. The inverse feedback branch 116 includes a transistor 119 with ohmic resistance R connected with respect to the static OFF-voltage $V_{EE}$ of the driver output stage. The di/dt sensor 31 can be used as control source. If the current change velocity exceeds a threshold, the output voltage of the sensor 31 rises above a limit based on which a Zener diode 118 is designed. Thereby, the Zener diode 118 and hence the transistor 119 becomes conductive and inverse feedback becomes active. In that case, the static OFF-voltage can be used as inverse feedback potential. By discharging part of the gate current into the di/dton-clamp (inverse feedback branch 116), the gate current change is reduced and the current change velocity drops. Thus, the active di/dton-clamp can be referred to as superordinate protective instance which is part of the security concept.

Further, the device 50 includes the voltage monitor (Vge/Vgs-Monitor) 122 that is configured to detect the control voltage (gate voltage) and the voltage at a terminal of the sensor resistor Rs facing away from the control terminal, respectively and to compare the same with a threshold provided by the control device 56. The voltage monitor 122 is configured to provide a differential signal based on the comparison and to provide the same to the control device 56.

For this, the voltage monitor 122 can comprise, for example a comparator circuit that is configured to compare the control voltage with a static threshold. The static threshold can, for example, be the threshold voltage of the semiconductor-based switch 12. The threshold voltage can be variable during operation, i.e. at runtime. Thus, the voltage monitor can be configured to check whether the gate threshold voltage is undershot. The control device 56 can be configured to control the controllable switch 108 based on the signal provided by the voltage monitor 122. This enables prevention of undesirable (re-) bias, i.e. activation of the semiconductor-based switch 12 by a voltage rise via the semiconductor-based switch 12. The voltage rise can increase the gate potential of the semiconductor-based switch 12 via the Miller capacitance.

In the following, reference is made to functions of the control device 56 that are illustrated as functional blocks in a schematic block diagram. The control device 56 can, for example, be a digitally programmed circuit, for example in the form of a digital signal processor (DSP), a programmable gate array (PGA) or in the form of a microprocessor.

The control device 56 includes an input interface 124 referred to as RX-IF. The input interface 124 is configured to receive control instructions, for example from a superordinate control unit 126. The superordinate control unit 126 can be galvanically separated from the device 50 and/or the control device 56. The control instructions can be received, for example as a pulse-width modulated (PWM) signal. The control instructions can be received via a receive channel, for example as a 1-bit data stream in order, for example, to receive ON/OFF information. Alternatively, the receive channel can also include symbols with more than one bit.

The transmission and hence the reception of the control instructions at the input interface 124 can be performed optically by means of an optical interface. For that, the input interface can have the optical interface. This allows galvanic separation to the superordinate interface 126. Further, optical data transmission allows superposition of the data stream with additional information from the superordinate control unit 126, for example, a main control of the digital-controlled active gate drive unit (DCAGDU). The superimposed additional information can be modulated at runtime within the PWM-ON message as n-bit data stream. In that way, parameter adaptations, such as the current intermediate circuit voltage to which the device 50 is connected can also be transmitted. Alternatively, transmission can also be performed by means of electric signals.

Such information can be used by the control device 56 to adapt the switch-on and switch-off sequence, respectively, in the range of the du/dt phases. Other information for adaptation adapting the switching sequences at runtime can also be transmitted. Further, the input interface 124 can be configured to implement a so-called watchdog function, i.e. a functionality check by the primary side (superordinate control 126). This means that the superordinate control 126 can be configured to determine erroneous function of the control device 56 and the transmission path, respectively, when the PWM signal is not or only partly received. The superimposed information can be implemented, for example by an 8-bit value within the PWM signals. A realized protocol can have, for example, two functions.

The first function can include control information. For this, the superordinate control 126 can transmit a primary-side switching command ON or OFF to the GCU. A second function can include a transmission of a current value of the intermediate circuit voltage (UZK) which can be applied to the semiconductor-based switch during the on-command in real-time. The same can be used by the GCU in order to determine the voltage change velocity and adapt the same accordingly. Apart from that, implicit watchdog function of the primary side is implemented in that it is monitored whether the primary-side PWM pattern is permanently generated.

The sequence is, for example, as follows:

The primary-side modem controller receives the switch-on signal of the control as well as a digitized value for the height of the intermediate circuit voltage. The respective PWM pattern is generated from these values. The period duration of the PWM signal is identical and has to be shorter than the secondary-side short impulse suppression time constant. First, a static ON-signal is transmitted until the secondary-side feedback channel returns an ON-signal after passing through the short impulse suppression. From now on, a LOW-HIGH pattern with fixed period duration is transmitted by the modem transmitter. The ratio of HIGH to LOW is proportional to the height of the intermediate circuit voltage. Accordingly, in an 8-bit digital value, the following limits result:

$$UZK=0 \rightarrow tlow/thigh=1/255; UZK=0.5*UZKmax \rightarrow tlow/thigh=127/128; UZK=UZKmax \rightarrow tlow/thigh=255/1.$$

Switch-off signaling is performed in dependence on the current PWM portion. If a HIGH portion is currently active, the modem will statically change to LOW. With the confirmation of the feedback signal after termination of the short impulse suppression, the modem sequence is successfully terminated and allows new ON-commands.

If a LOW portion is currently active, the modem changes from LOW to static HIGH. The secondary-side feedback signal detects the static HIGH state after termination of the short impulse suppression and changes to LOW. Thus, also the modem output statically returns to LOW and allows new ON-commands.

Further, the control device 56 comprises an output signal interface 128 referred to as TX-IF. The output signal interface can be configured to transmit an active signal to the primary-side control instance, i.e. the superordinate control unit 126, for example when an error state, such as undervoltage, timeout, short-circuit or excessive temperature has been detected. The control device 56 is configured to determine such an error state by means of internal monitoring.

Alternatively, the output signal interface 128 can be configured to implement the respective signal transmission path towards the superordinate control unit 126 as watchdog of the secondary side (i.e. the device 50). For example, an alternating ON/OFF signal pattern can be permanently transmitted from the output interface 128 in order to signalize that the DCAGDU is active, i.e. the device 50 is operable. In the error case, a permanent error signal can be transmitted. Alternatively, the error signal can also be transmitted in intervals or once. Alternatively, the output signal interface 128 can be configured to transmit, in a deactivated state of the device 50, the signal with a constant polarity and/or a constant intensity level, such that the signal remains also static and constant, respectively.

Alternatively, the output signal interface 128 can be configured to transmit a feedback signal to the input signal interface 124. The output signal interface can be configured, for example to transmit a static "GOOD" signal when no PWM signal is applied to the input signal interface 128, in order to signalize that no error has been detected. In the error case, the output signal interface 128 can be configured to transmit an error signal (or BAD signal). If a PWM ON-signal is received at the input signal interface 124, the feedback signal can be transmitted after the signal passage chain (signal processing) by the output signal interface 128 such that the respective signal comprises a level change or polarity change in order to signalize that the PWM signal has arrived and is being processed.

It is an advantage that the superordinate control unit 126 can be configured to determine, based on a time difference between a signal transmitted to the device 50 and a signal received by the device 50 based thereon, a signal runtime in real-time to the runtime and for example in parallel connections of power switches, i.e. several devices 10, 20 and/or 50 whether adaptations are to be performed for synchronizing the PWM signals. Alternatively or additionally, during a PWM OFF-phase, i.e. while a command for deactivating the semiconductor-based switch 12 is received, state information of the driver side can be transmitted as serial data stream.

Further, the control device 56 includes a register database (TimingConfig Register) 132, for example in the form of a memory partly or completely comprising control times for the dynamic switching phases. The control times can, for example, be used as basic configuration and as criterion for timeout, respectively, by the control device 56 for sequence control of switching processes. The control times can be programmed, i.e. stored as configuration data during programming the control device 56. Alternatively or additionally, the control times can be changed or replaced during operation, i.e. at runtime, for example the PWM protocol by the superordinate control unit 26 (primary-side control). The control device 56 is configured to readjust the control times of individual switching portions during switching processes, depending on the operating point, i.e. to perform independent adaptation of the control times.

The register database 132 is logically connected to the input signal interface 124 and configured to receive information from the same.

The control device 56 includes a status register in the form of a register databank 134. The status register 134 is coupled to the output signal interface 128 and configured to provide information to the same.

Status information of the device 50, i.e. the DCAGDU can be stored in the status register 134. The same can, for example, be parameters for detecting under-voltage errors, timeouts of the sequence control (protocol of the control device 56), overcurrent and/or short-circuit errors. The control device 56 can be configured to return, via the feedback path, i.e. the output signal interface 128, a respective status signal to the primary state side control 126. Alternatively, the control device 56 can be configured to transmit detailed information to the superordinate control unit 126, for example in the form of a serial status data stream.

The control device 56 includes a functional unit for error handling (error handler) 136. The same is configured to set a secure state of the device 50 in the case of an overcurrent and/or a short-circuit and an under-voltage, respectively. Acknowledging an error can, for example, be performed by an "OFF"-signal that is transmitted via the PWM input signal and received at the input signal interface 124. Alternatively or additionally, acknowledging can be performed such that, for example, the OFF-signal has to be applied for a defined time period. Such an acknowledging timeout (time duration of a signal level) can be freely defined, for example more than 100 ns, more than 1 ms or more than 10 ms or even longer.

The control device 56 includes a functional block (Config Vge/Vgs-Monitor) 138 for configuring the Vge/Vgs-Monitor 122. The Config Vge/Vgs-Monitor 138 is configured to provide the defined threshold to the Vge/Vgs-Monitor 122, this means to transmit respective information to the same. This can be in the form of a digital signal that can be converted to an analog reference voltage Ref Vge,th by a DAC of the Vge/Vgs-Monitor 122. The Vge/Vgs-Monitor 122 is configured to set, based on the obtained signal, a specific threshold at a differential amplifier or a comparable circuit and to compare the gate voltage with regard to exceeding or falling below the threshold and to provide the exceeding or falling below to a functional block for digital monitoring of the gate control voltage (Sens Vge/Vgs-Monitor) 142.

The threshold can be generated, for example by switching-in a fixed or variable reference voltage at the Vge/Vgs-Monitor 122. Alternatively, the threshold generation can be performed in a variable manner by generating a PWM duty cycle in combination with a connected lowpass and function of a DAC. Thereby, the analog value of the detected gate voltage can be detected in discrete stages.

The control device 56 includes the functional block Sens Vge/Vgs-Monitor 142 for digitally monitoring the gate control voltage. The same is configured to receive a signal transmitted by the Vge/Vgs-Monitor 122 and to monitor the digital threshold. An information, for example based on a comparison "Vgs/Vge<Ref Vge,th" can be provided to a functional block "ActiveOff Controller" 144. The ActiveOff Controller 144 is configured to control the controllable switch 108. Alternatively or additionally, the Sens Vge/Vgs-Monitor 142 can be configured to determine the threshold voltage from which the semiconductor-based switch 12 starts to carry current. This can be performed by means of evaluating the output signals provided by the Vge/Vgs-Monitor 122 based on the variable thresholds. Thus, the Sens Vge/Vgs-Monitor 142 can form, together with the Config Vge/Vgs-Monitor 122, an analog-to-digital converter (ADC).

Further, the control device 56 includes the ActiveOff Controller 144 coupled to the functional module 142. The ActiveOff Controller 144 is an actuator module for controlling the controllable switch 108. If the control device 56 detects that the gate voltage falls below the defined threshold, the control device 56 can trigger activation of the ActiveOff 108 (short circuit) which is directly attached, i.e. connected to the gate signal, i.e., the control terminal. Thereby, undesired (re-) bias of the semiconductor-based switch 12 can be prevented, for example by coupling-in du/dt.

The control device 56 includes a configuration module Config di/dt-Monitor 146, that is configured to configure the di/dt-Monitor 94, i.e., to provide comparative values to the same. The Config di/dt-Monitor 146 is configured to set the multiplexers 98a and 98b and to change the comparison thresholds of the comparators 96a and 96b.

The di/dt-Monitor 94 is configured to detect or to monitor, in a bidirectional manner, both the current change velocity during switching-on (activating) the semiconductor-based switch 12, the current change in the switched on state as well as the current drop velocity during switching-off (deactivating) the semiconductor-based switch 12. The Config di/dt-Monitor 146 is configured to dynamically change the reference thresholds of the di/dt-Monitor 94.

The control device 56 further comprises a monitoring functional block Sens di/dt-Monitor 148 that is coupled to the Config di/dt-Monitor 146. The Sens di/dt-Monitor is configured to receive the comparative results of the di/dt-Monitor 94 and hence to monitor the current change velocity (di/dt) in two stages. The control device 56 is configured to detect, by means of the Sens di/dt-Monitor 148, a time instant at which the current flow in the semiconductor-based switch 12 changes (beginning of the current change), a short-circuit in the active state of the semiconductor-based switch 12 as well as the set value of the current change velocity during activation (switching-on) and deactivation (switching off) of the semiconductor-based switch 12.

The control device 56 includes a functional block Config VonMid 152 that is configured to control the DAC 62 of the controllable activation voltage source 58 and to provide a digital signal to be converted to the same, respectively. The functional block Config VonMid 152 can hence be described as digital configuration of a control voltage for gradual adaptation of the current change velocity during the activation process. Based on gradual control of the DAC 62 for gradual adjustment of the comparative voltage of the differential amplifier 64, thus, the voltage of the controllable activation voltage source 58 can also be adjusted. A set value predetermined by the controllable activation voltage source 58 can be determined by a threshold of the di/dt-Monitor 94 comparing a set state with the current state. The functional block Config VonMid can be configured, for example, to change such a control voltage in 256 stages (8 Bit) in the range above the gate threshold voltage ad the static gate-on-voltage and the source voltage $V_{CC}$, respectively. This allows control of the gate current and hence the current change velocity of the semiconductor-based switch 12 with respect to the predetermined set value depending on the operating point. Alternatively, a variable output voltage of the activation voltage source 58 can also be obtained in that a constant voltage potential is connected to a variable output resistance.

If the controllable activation voltage source 58 is, for example, configured to provide a constant voltage potential with variable output resistors, the functional block Config VonMid 152 can be configured to gradually adjust the output resistance, for example in 128, 256 or 512 or more stages. Alternatively or additionally, when the controllable activation voltage source 58 comprises both a gradually adjustable output voltage as well as a gradually adjustable output resistance, the functional block Config VonMid 152 can be configured to gradually change both the voltage potential and the output resistance.

Further, the control device 56 comprises a configuration block Config Ioff 154 that is configured to adjust the controllable impedance 88. This can be performed, for example, by a digital configuration of the controllable impedance 88 (current sink) for gradual adaptation of the current drop velocity to a definable set value during a deactivation process. The set value can be defined by a threshold of the di/dt-Monitor 94. The functional block Config Ioff 154 is configured to set the controllable impedance 88 by means of a control voltage, for example in 256 stages in the range below the static gate-on-voltage and a voltage above the gate threshold voltage. Alternatively, the functional block Config Ioff can be configured to vary the control voltage in one of 256 different numbers of stages, for example 128, 512, 1024 or more. Thereby, a gate resistance (Rgoff) and hence the current drop velocity can be controlled to the set value depending on the operating point.

Further, the control device 56 comprises a functional block for central sequence control (FSM Closed Loop ON-Control/OFF-Control) 156. The central sequence control 156 is configured to obtain information from the TimingConfig Register 132 and to update its information for obtaining information from the error handler 136 and to provide information to the status register 134 in order to control the functional block Config di/dt-Monitor 146 for obtaining information from the module Sens di/dt-Monitor 148 and to control functional blocks Config VonMid 152 and Config Ioff 154. The central sequence control 156 is further configured to control the controllable switches 68a and 68b, to control the controllable switches 75a and 75b and hence the controllable resistive circuit 74, to control the controllable switches 22c and 22d and hence the controllable resistive circuit 82 and to control the controllable voltage source 84.

Here, the central sequence control 156 is configured to determine, based on a current value analysis of a current time interval, for example an actual current rise velocity or an actual current drop velocity, set values for a next switching period and to determine, in the current switching period, the set values based on the actual values of the previous switching period, respectively. A switching period can have, for example, a time period of less than 50 ns, less than 100 ns or less than 200 ns. In other words, the central sequence control 156 is configured to perform control of the output stages for the switch-on sequence, the switch-off sequence, the fixed and variable switch-on voltage as well as the fixed switch-off voltage, the variable switch-off impedance, the configuration of the di/dt-Monitor and the dynamic change of the control times. The same is embodied, for example, as trailing digital control loop. A digital control loop can have a direct feedthrough (durchgriff), such that a sequence or time portion can already be adapted in the current period (k). Since it is hardly possible, especially for fast switching processes in the 100 nsec range, to realize immediate control of the switching sequences, the approach of tracking control with direct feedthrough can be used here. This means that in the switching period k all control parameters are adapted according to the switching behavior in switching period k−1 and are used in the switching period k for the control. According to the control deviation for di/dt as well as the timings for the control portions, the control parameters are changed and used for the next switching period k+1. The timings can be adapted based on the direct feedthrough already for the current switching period k. The control parameter adaptation is performed independently both for the switch-on sequence and for the switch-off sequence.

In other words, the VonMid-Control 58 represents the executing unit of a Config VonMid-Modul 142 and readjusts the current change velocity in the switch-on phase. Here, for example, the approach of adjustable source voltage with fixed resistance Rgon is used. As is known, the current change velocity can be adjusted in the active region by the voltage change velocity of the gate voltage. Thus, the same can be varied via the change of the gate control current in this time period. Thus, with fixed resistance Rgon, the gate current can be influenced by changing the driving source voltage. By the feedback of the di/dt-Monitor 94 during the last switch-on edge, it has been determined whether the current change velocity has been greater than the set value or smaller. If the set value becomes smaller, the control voltage for the di/dt portion is increased by at least one stage. Thus, in the next switch-on portion, the gate current rises and, hence the current change velocity rises.

However, if in the last switch-on edge a current change velocity that was greater than the set value has been determined, the control voltage for the di/dt section is reduced by at least one stage. Thus, in the next switch-on portion, the gate current is reduced and, hence the current change velocity is reduced.

In one implementation option, control voltage adaptation is performed by means of a digitally adjustable voltage regulator. The output voltage of the same is, for example, recalculated and adapted in 256 stages by the digital core, i.e., the control device 56 after passing each switch-on edge.

According to the switch-on portion, the Von-Control 66 sets the necessitated driving voltage of the Gate-On paths. Up to the end of the di/dt phase during the switch-on edge, Von-Control connects the dynamically adjustable control voltage VonMid to the control paths. Then, switching to the static on-voltage VCC is performed and the gate is operated with this voltage via the respective control paths.

Thus, it is also possible to set the control output stage in a completely voltage-free state and, hence, prevent undesired switching-on of the power switch by errors in the downstream control paths.

According to the current switch-on portion, the Ron-Control 76 sets the matching resistance path configuration. In a first implementation option, the same consists of two parallel switchable resistance paths having fixed values. Basically, four configuration options result. For switch-on portions I and IV, both paths are active simultaneously. In portion II only path k1.1 and in portion III only path k1.2. Thereby, the di/dt portion can be controlled independently of the du/dt portion. In a further implementation option, the number of independent paths can be extended as needed.

According to the current switch-off portion, the ROff-Control 82 sets the matching resistance path configuration. In a first implementation option, the same consists of two parallel switchable resistance paths having fixed values. Basically, this results in 4 configuration options. For switch-off portions I and IV, both paths are active simultaneously. In portion II, only path k2.1 and in portion III only path k2.2. Thereby, the di/dt portion can be controlled independently of the du/dt portion. In a further implementation option, the number of independent paths can be extended as needed.

According to the switch-off portion, the VOff-Control 84 sets the necessitated driving voltage of the Gate-Off paths. In a first implementation option, up to the end of the di/dt phase during the switch-off edge, Voff-Control connects the voltage VDD as voltage sink to the control paths.

In this option, $V_{DD}$ is the supply voltage of the digital core as well as LV periphery, i.e., the further active circuit parts of the device 50. Thus, a large part of the charge fed into the gate of the power switch during switching-on is "recycled". This represents a smart option of minimizing the energy consumption of the GDU. Recycling can work when the voltage $V_{DD}$ is smaller than the gate threshold voltage of the power switch. Then, switching to the static OFF voltage $V_{EE}$ is performed and the gate is discharged completely up to the defined OFF voltage $V_{EE}$.

Thus, it is also possible to set the control output stage into a completely voltage-free state and hence to prevent undesired switching-on of the power switch by errors in the downstream control paths.

The IOff-Control 88 represents the control instance for adjusting the current drop velocity. In a first implementation option, for example, the approach of gradually adjustable impedance/current sink is used.

During switch-off portions I and II, the impedance is configured to the minimum value and merely the fixed resistor of the paths in the ROff-Control is effective. When the di/dt portion is entered, the impedance is configured to a value that leads to the desired current drop velocity.

It is known that the current drop velocity in the active area can be adjusted by the voltage change velocity of the gate voltage. Thus, the same can be varied by varying the gate control current in this time period. Thus, with fixed discharge voltage sink, the gate current can be influenced by changing the discharge resistance RGoff. By the feedback of the di/dt-Monitor 94 during the last switch-off edge, it has been determined whether the current drop velocity was greater or smaller than the set value. If the actual value was smaller, the adjustable impedance is reduced by at least one stage for the di/dt portion. Thereby, in the next switch-off portion, the gate current is increased and the current drop velocity is increased.

If, however, in the last switch-off edge, a current change velocity greater than the set value has been determined, the adjustable impedance for the di/dt portion is increased by at least one stage. Thereby, in the next switch-off portion, the gate current is reduced and hence the current drop velocity is reduced.

In one implementation option, the impedance change is performed by means of a digital-controlled transistor in analog operation. The forward resistance of the same is recalculated and adapted, for example, in 256 stages by the digital core after passing each switch-off edge. In an alternative implementation option, the number of stages can be increased further. In an alternative implementation option, the adjustable path can be a completely independent path without dynamical switching of the impedance from switching operation to analog operation.

The Active GateClamp 102 is part of the security concept and represents a protective instance against Miller-induced switching-on of the power switch 12. In a first implementation option, the same is only effective during the switch-off sequence and in the deactivated state. The same is realized by a short-circuit transistor 104 connected between the gate control line and the reference potential GND of the GDU. The same is activated by an inadmissible voltage drop at a sensor resistor Rs. If the potential on the side of the power switch is by at least a threshold amount higher than the driver side potential, high-energy feedback, for example by Miller coupling, exists. This can result in undesired exceeding of the gate threshold of the power switch and the same becomes conductive again. The Active GateClamp prevents that by dynamically short-circuiting the control gate.

The ActiveOff 108 is part of the security concept and represents a further instance operating as static short-circuiter of the control gate terminal. However, the same does not act dynamically in an independent manner like the Active GateClamp 102 but is controlled by the digital core. The gate voltage is detected by the Vge/Vgs-Monitor 122. If the gate voltage falls below a configured threshold, this is indicated to the digital core and the ActiveOff Controller 144 activates the short-circuiter Active GateClamp 102. A voltage level where the switch-off process is terminated and merely the gate voltage is to be discharged further is defined as a threshold in order to increase the interference reserve. Thus, ActiveOff 108 supports the switch-off sequence, at the earliest starting from the switch-off portion IV and acts as discharge accelerator and at the same time as low impedance static short-circuiter.

The Active di/dt-Off-Clamp 112 is part of the security concept and represents a superordinate protective instance against inadmissibly high current drop velocities. In the case of an error in the sequence control of the digital core or error cases in the load circuit of the power switch 12 resulting in current drop velocities significantly above the defined set value, the di/dt-Off-Clamp 112 becomes active and acts as inverse feedback branch in order to limit the current steepness. Contrary to normal control, this intervention is lossy.

The digital-controlled active gate drive unit (DCAGDU) can include the following functional units: digital core, di/dt-Monitor, VonMid-Control, Von-Control, Ron-Control, Roff-Control, Voff-Control, Ioff-Control, Active GateClamp, ActiveOff, Active di/dt-Off-Clamp, Active di/dt-On-Clamp, di/dt-Scaling, di/dt-Sens as well as Vge/Vgs-Monitor.

Figure 6:
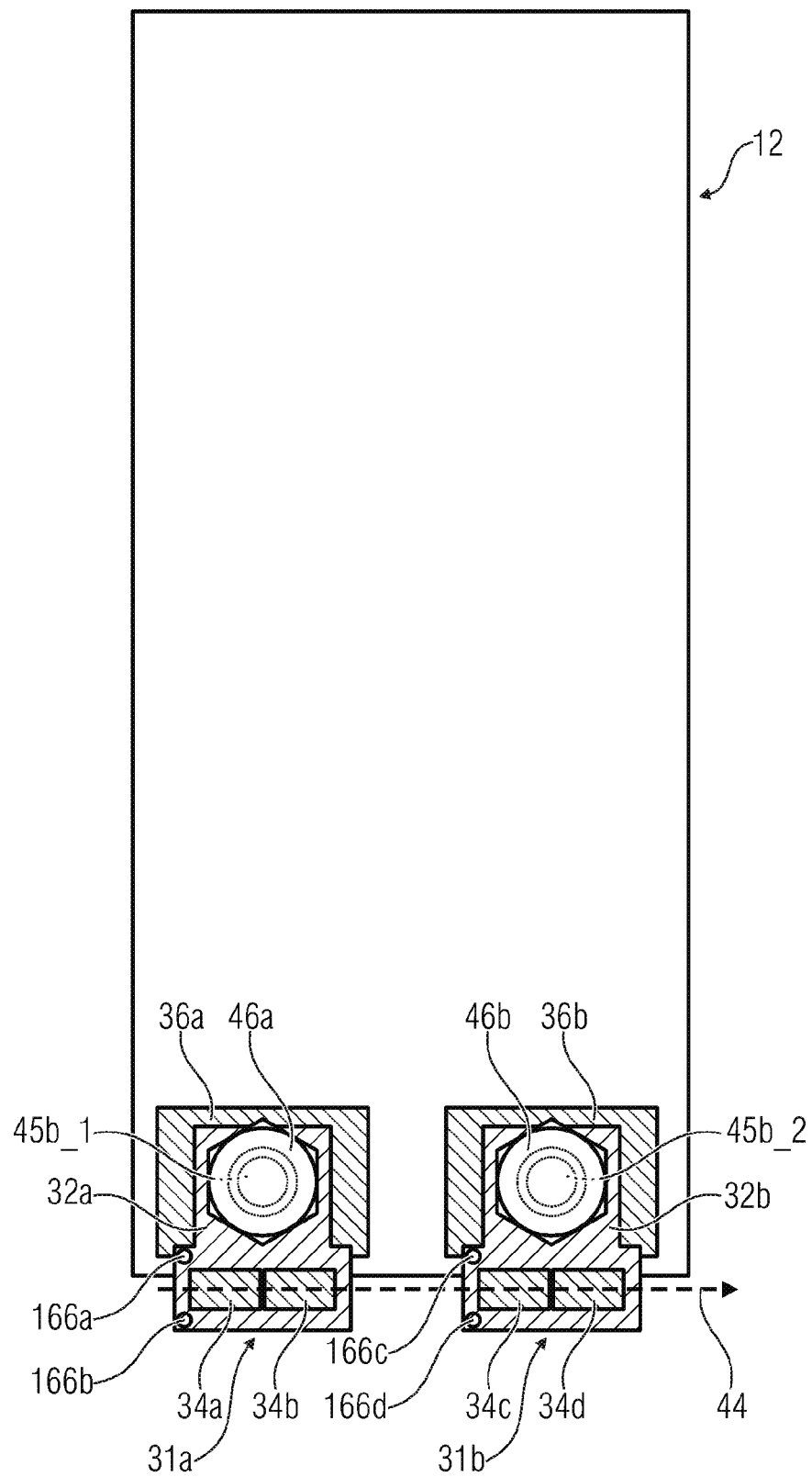
FIG. 6 is a schematic illustration of the semiconductor-based switch where, a first sensor for detecting the current change velocity of the power current is arranged at the first power terminal and wherein a second sensor for detecting the current change velocity of the power current is arranged at the second power terminal.

FIG. 6 shows a schematic illustration of the semiconductor-based switch 12 where a first sensor 31a for detecting the current change velocity of the power current flowing through the semiconductor-based switch 12 is arranged at the first power terminal 36a and wherein a second sensor 31b for detecting the current change velocity of the power current is arranged at the second power terminal 36b. The first power terminal 36a, can, for example, be a source terminal of a MOSFET or a collector terminal of an IGBT. The second power terminal can, for example, be a drain terminal of the MOSFET or an emitter terminal of the IGBT. Alternatively, the first power terminal 36a and the second power terminal 36b can be exchanged. The sensors 31a and 31b, respectively, each include an insulating foil 32a and 32b, respectively as described for the sensor 31. On the insulating foil 32a and 32b, respectively, inductances 34a and 34b and 34c and 34d, respectively, are arranged and are configured to detect the magnetic field at the respective power terminal 36a and 36b, respectively. The insulating foils 32a and 32b, respectively, include the mounting portion 45a and 45b, respectively, which is configured to allow an assembly at the respective power terminal 36a and 36b, respectively. For example, a current feed or a current drain, such as a cable, can be mounted, for example, screwed on the power terminal 36a and 36b, respectively, such that the respective assembly, such as the screw connection can be used for fixing the sensor 31a and 31b, respectively at the power terminal 36a and 36b, respectively.

A current direction of the power current can be, for example, arranged perpendicular to a plane where the insulating foil 32a and 32b is arranged in space. A current detection direction of the inductances 34a-d can be arranged, for example, parallel to a viewing plane. This means that the preferential direction 44 which is the same for all inductances 34a-d in this implementation option, is perpendicular to the current flow direction in space.

The sensors 31a and 31b, respectively, comprise connecting terminals, i.e. connecting points 166a and 166b and 166c and 166d, respectively, that are configured to provide the measurement voltage of the respective sensor 31a and 31b, respectively. The connecting terminals 166a-d are arranged on the insulating foils 32a and 32b. This means that a signal provided by the inductances 34a-d can be guided on or in the insulating foil 32a or 32b, for example, by means of a conductive trace, to the respective connecting terminal 166a-d and in that way a distance between a measurement line and the power terminal 36a and 36b, respectively, can be increased. In that way, the connecting terminals 166a-d can be arranged spaced apart from the inductances 34a and 34b, respectively. This allows increased electrical insulation and reduction of spurious influences. For example, the connecting terminals 166a and 166b and 166c and 166d, respectively, can be connected to a shielded or non-shielded two-wire line that is configured to transmit the respective measurement voltage. The terminals can be mechanically and electrically fixed to the two-wire line, for example by means of a screw or solder connection.

Alternatively, the sensors 31a and 31b can also be configured differently. One of the sensors 31a or 31b, for example, can have one of two different numbers of inductances 34a/34b and 34c/34d, respectively. Alternatively or additionally, one or several inductances can have a preferential direction differing from the preferential direction 44.

In other words, the di/dt-Sens (sensors 31a and 31b, respectively) represents a central sensor instance which is both part of the normal control and part of the security concept. In a first implementation option, the sensor can be implemented as external measurement means in the form of a small printed circuit board foil 32a and 32b, respectively. This foil 32a and 32b, respectively, fulfills the requirements of functionalization and can be mounted directly onto the terminal of the load emitter/load source of the power switch which is connected, for example, at the intermediate circuit, for example, at the minus potential and can be screwed together with the terminal 36a and 36b, respectively by means of a screw hole (mounting portion) 45b_1 and 45b_2, respectively.

A di/dt sensor 31a and 31b, respectively, can also be arranged at the power switch that is connected, for example, to the load collector/load drain at the intermediate circuit, for example, at the plus potential, and can be screwed onto this terminal 36a and 36b, respectively. Thus, each power circuit can comprise a di/dt sensor according to its arrangement in the topology of the power part that is arranged in the respective commutation circuit. As an actual detection element, a wound inductance is used in the first implementation option. The size of the inductance is freely selectable and depends on the necessitated output signals. The inductance 34a/34b and 34c/34d, respectively, can be arranged as individual component or as a series connection. A member having a ferrite core as a field concentrator is advantageous. The inductance(s) 34a/34b and 34c/34d, respectively, can be implemented as a commercially available surface mounted device (SMD) ferrite throttle in SMD design or can also have any other design such as in a through hole technology (THT). The inductances 34a/34b and 34c/34d, respectively, can have any inductance value, for example, 100 μH, 1 mH or 10 mH.

The distance of the sensor or the inductance to the current rail on which the sensor board is mounted as well as the orientation of the inductance with regard to the current direction can have a relevant influence. If possible, the orientation can be perpendicular to the current direction in order to detect the maximum field. With respective spacing sheets below the sensor foil, i.e. between the insulating foil 32a and 32b, respectively, and the semiconductor-based switch 12, the insulation ability can be increased and/or scaling of the signal amplitude can be performed, since the field strength and hence the measurement voltage decreases with the distance of the sensor 31a and 31b, respectively, to the current rail.

The sensitivity can hence be adjusted both via the selection parameters length, width, number of turns, flow concentrator, number of members in series of the inductance as well as by varying the distance between sensor foil and current rail.

The di/dt sensor 31a and/or 31b can be connected to the GDU, i.e. the control device, by a suitable two-wire connection via the connecting terminal 166a/166b and 166c/166d, respectively. This can be made, for example, as a pure two-wire connection. The two-wire connection can be twisted in order to increase interference susceptibility. Alternatively or additionally, the connection can be made as shielded two-wire connection with a shielding connection on a suitable potential on the GDU.

For processing the measurement voltage further, the di/dt sensor 31a and 31b, respectively, is provided with high frequency (HF)/low frequency (LF) scaling (matching circuit) on the GDU (di/dt scaling). Thereby, both the signal termination of the measurement voltage as well as the adaptation of the measurement amplitude to the further processing instances can be enabled. The termination and the scaling, respectively, can be realized via a passive resistive and/or capacitive voltage divider on the GDU. Thereby, a signal offset by an active signal adaptation can be prevented. Alternatively, scaling can be performed by an active impedance conversion. This enables the scaling and adaptation, respectively, of the same. Alternatively or additionally, scaling can also be performed by means of a digitally adjustable transmission ratio, for example, by means of a programmable gate array (PGA) or by means of a digital potentiometer.

Alternatively, the power terminal 36a can also be arranged on a first semiconductor-based switch 12 and the power terminal 36b on a second semiconductor-based switch 12, wherein the two semiconductor-based switches 12 are connected to a half bridge configuration. A load can be arranged between the two semiconductor-based switches.

It is an advantage of the above described aspects, both individually as well as in a combination of several aspects, that a compact design of circuits can be obtained for cost-effective and simple integration option of the systems. Further, a number of active and passive components regarding the obtained functionality is low which results in high reliability and high cost efficiency. Implementation and combination, respectively, of the above-described aspects with a digitally configurable functional core allows the realization of functions that have so far been difficult or not possible, as well as easy reconfiguration, i.e., adaption to other applications, edge parameters and/or functional characteristics and hence a high degree of reusability and a high matching freedom, such that tedious and possibly expensive new development or redesign of a control can be prevented when a different type of switch is to be controlled. With the help of a sensor, a measurement instance that is independent of the power switch module, i.e., the semiconductor-based switch, is provided, which is not based on the parasitic inductances within the switch. A respective form factor can be adapted to a high degree to a respective terminal connection (connection of the semiconductor-based switch).

Omitting high-performance analog active components saves signal delay times, component costs and enables reduced energy consumption.

Status determination based on the sensor according to the third aspect enables prevention of using the collector or drain potential for status and/or protective purposes. This enables prevention of using inaccurate and possibly a great number of high-volt (HV) components possibly having high installation space requirements and additionally necessitate, due to the necessitated voltage clearances, unused installation space. In some HV switches, such a sufficient installation directly on the respective form factor of the GDU assembly according to conventional technology is not possible, such that its secure operation is only facilitated according to the above-described aspects.

The described readjusted control of the switching processes enables optimum behavior for almost any operating point and can hence save a significant part of the switching losses. The described direct feedthrough allows adaptation of the switching behavior already during the current switching period. Switching, i.e., the switching behavior can be executed in a softer way at the portion boundaries, such that interference radiation during operation is reduced and, for example, standard requirements can be met or even higher standard requirements can be met. This allows the admission of possibly expensive external filter measures.

One or several signal interfaces for superordinate control, such as RX-IF 124 and/or TX-IF 128 allow cross-wise watchdog functionality which can result in increased reliability. Implementing the second aspect in the GDU enables internal consumption savings by recycling the control energy of the semiconductor-based switch. The possible reconfiguration of the switching parameters at runtime allows superimposed adaption of the behavior.

Figure 7:
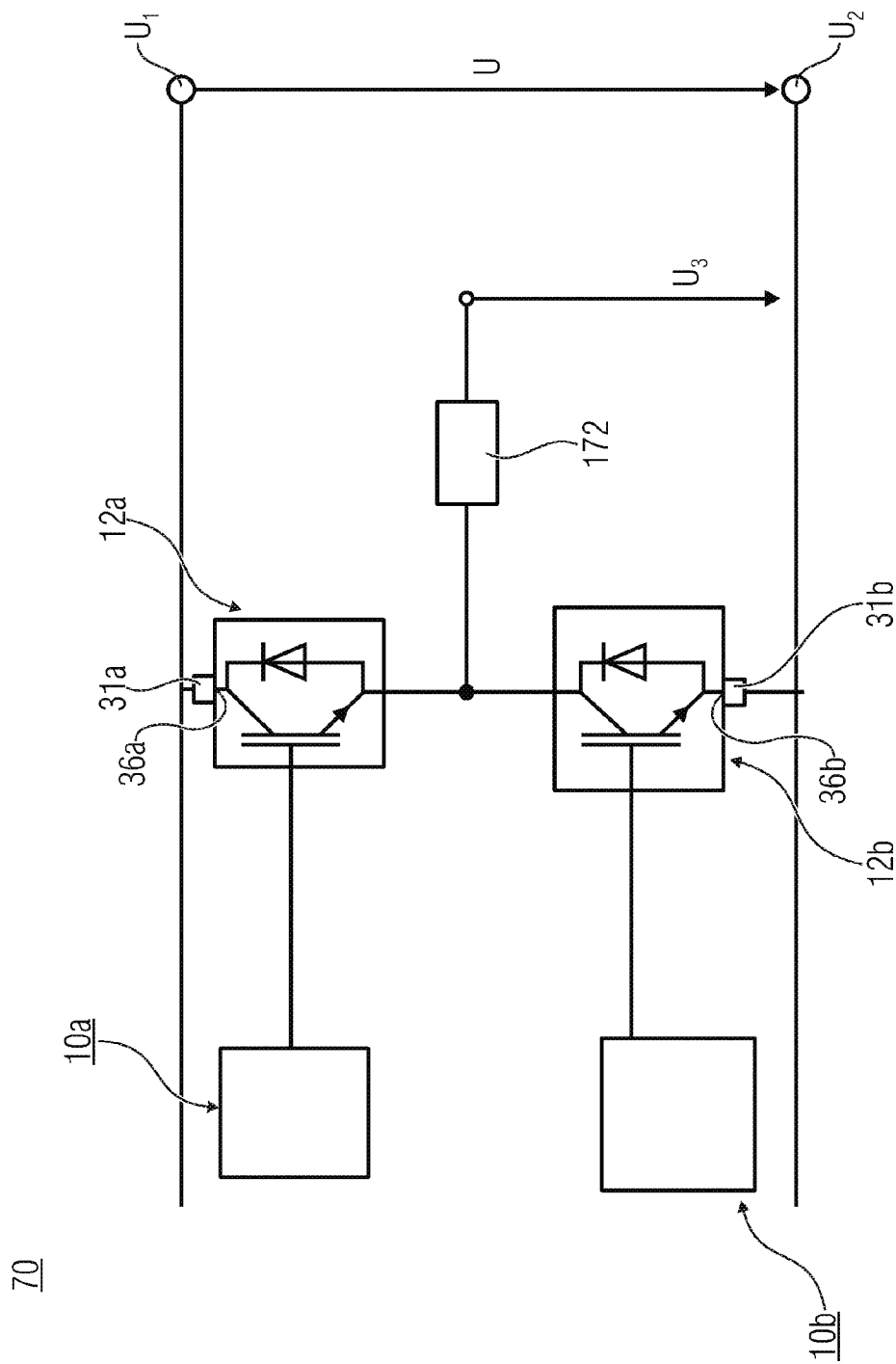
FIG. 7 is a schematic block diagram of an electric circuit comprising a commutation circuit with a first voltage potential and a second voltage potential.

FIG. 7 shows a schematic block diagram of an electric circuit 70 comprising a commutation circuit having a first voltage potential $U_1$, for example a plus potential, and a second voltage potential $U_2$, for example a minus potential. This means that the electric voltage U is applied between the potentials $U_1$ and $U_2$. The electric circuit 70 includes two semiconductor-based switches 12a and 12b that are connected to a half bridge circuit. The half bridge circuit comprises a load terminal between the semiconductor-based switches 12a and 12b that is connected to a load impedance 172, for example of an electric consumer. By means of the semiconductor-based switches 12a and 12b, the load impedance 172 can be switched between the potentials $U_1$ and $U_2$ with regard to a potential $U_3$.

The load impedance 172 can be an impedance of any electric consumer, for example an electric motor, an actuator, a sensor or, for example, a light or radiation source. Alternatively, the load impedance can also be the impedance of a generator that can be switched between the potentials $U_1$ and $U_2$ by means of the semiconductor-based switches 12a and/or 12b.

A device 10a is configured to control the semiconductor-based switch 12a. Further, a device 10b is configured to control the semiconductor-based switch 12b. The sensor 31a is arranged at the power terminal 36a, such as a load collector or a load drain terminal of the semiconductor-based switch 12a, wherein the power terminal 36a is connected to the potential $U_1$. The sensor 31b is arranged at the power terminal 36b, for example the load emitter or a load source terminal of the semiconductor-based switch 12b, wherein the power terminal 36b is connected to the potential $U_2$.

Alternatively, instead of the device 10a and/or 10b, a device 20 can be arranged to control the semiconductor-based switch 12a and/or 12b. Furthermore, merely one device 10, 20 or 50 can be arranged in order to control both switches 12a and 12b. Alternatively, the load impedance 172 can also be switched merely by means of switch 12a or 12b with regard to one of the potentials $U_1$ or $U_2$, i.e., alternative devices comprise, for example, merely one semiconductor-based switch 12a or 12b that is connected between the load and the potential $U_1$ or $U_2$.

Figure 8:
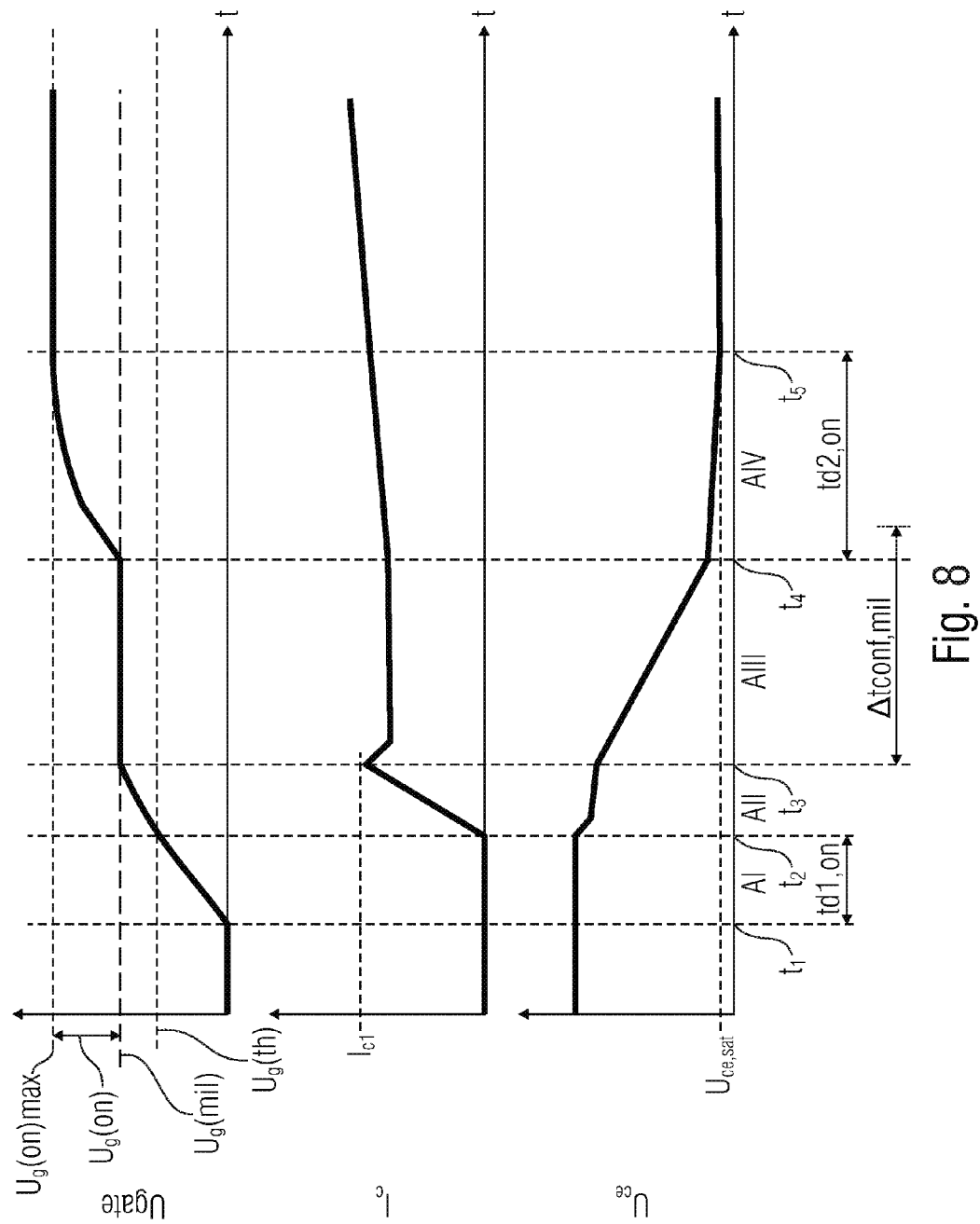
FIG. 8 shows schematic diagrams of current or voltage curves at the semiconductor-based switch during an activation process.

FIG. 8 shows schematic diagrams of current and voltage curves, respectively, at the semiconductor-based switch during an activation process. The semiconductor-based switch is, for example, an IGBT. For the IGBT, a curve of the gate voltage ($U_{Gate}$), a curve of the collector current $I_C$ and a curve of a collector emitter voltage $U_{ce}$ is plotted on a common time axis t. The time axis t has five time instants $t_1$, $t_2$, $t_3$, $t_4$ and $t_5$ that are arranged on the time axis t in the stated order. The activation interval I (portion AI) is arranged between time intervals $t_1$ and $t_2$. The activation potential AII is arranged between time intervals $t_2$ and $t_3$. The activation interval III (portion AIII) is arranged between time intervals $t_3$ and $t_4$. The activation interval IV (portion IV) is arranged between time intervals $t_4$ and $t_5$. This means that the activation intervals I to IV describe different portions (AI to AIV) of the activation process of the semiconductor-based switch. In the different portions AI to AIV, the control device can be configured to control the semiconductor-based switch differently based on different control targets. Depending on the activation interval I to IV, the semiconductor-based switch can be influenced by different physical effects which can result in different control targets of the respective control devices, such as the control device 24 or the control device 56. Based on the control targets, the respective control device 24 or 56 can be configured to adjust a varying circuit configuration at an electric circuit or further components in order to directly or indirectly influence the gate voltage.

The activation interval I (portion I) is represented by the delay time td1,on. The voltage $U_{ce}$ and the current $I_C$ remain almost unamended during this time. This means that during a change (rise) of the gate voltage $U_{Gate}$ below the threshold voltage $U_g(th)$, a conductivity of the switch remains almost unamended. If the semiconductor-based switch has the configuration "normally non-conducting", the switch is in the open state in this portion AI. The gate voltage UGate can be determined by the control device based on the measurement voltage of a current sensor, for example the current sensor 31. The determination can be made directly, for example by a computing operation, indirectly, for example in that the control device is configured to compare the current change velocity with a predefined threshold.

If the gate voltage $U_{Gate}$ reaches the threshold voltage $U_g(th)$, the semiconductor-based switch is configured to go into a conductive state, this means the power current $I_C$ begins to rise. Based on effective leakage inductances in the semiconductor-based switch, the voltage $U_{ce}$ drops to a lesser degree. In portion AI, a control target can be described in a delay time that is as short as possible, this means it is a target to increase the gate voltage $U_{Gate}$ in a time period that is as short as possible. With reference to FIG. 5a and FIG. 5b, for example, the voltage of the controllable activation voltage source can be in the range of the Miller voltage. A configuration of the controllable resistive circuit 76 set in the activation path 48 can be made, for example such that both resistors k1,1 and k1,2 are effective, this means that the ohmic resistance Rgon is formed of a parallel connection of the resistors k1,1 and k1,2. The transition into the portion AII (portion change trigger) is triggered when the gate voltage $U_{Gate}$ is greater than the threshold voltage $U_g(th)$ and/or a sens voltage Usens (di/dt), for example o the sensor 31, is smaller than a trigger voltage Utrig,off, which can have a lower positive voltage value. The control device is, for example, configured to compare the trigger voltage to the measurement voltage. Alternatively, the transition to portion AII can also be triggered when the gate voltage is greater than a trip threshold of the semiconductor-based switch 12.

In the activation interval II (portion AII), the current change velocity di/dt is essential. The current $I_C$ rises up to a current peak $I_{C1}$, the voltage $U_{ce}$ drops according to the parasitic inductances. This means that the conductivity of the semiconductor-based switch increases. A control target of the control device in the portion AII can be, for example, obtaining an edge of the voltage $U_{ce}$, that is as flat as possible, for reducing the return current peak as well as a lower fading oscillation and a lower interference radiation of the semiconductor-based switch. A respective circuit configuration can be made by the control device such that the voltage of the controllable activation voltage source is set in the range of the Miller voltage in order to obtain a soft return current peak due to the dropping current change velocity.

During the portion AII, the respective controllable resistive circuit, for example the controllable resistive circuit 18 or 74 can be configured to effectively switch an ohmic resistance k1,1 or k1,2 optimized, i.e. configured for the portion AII, for example the one having the greater resistance value. Transition into the following activation interval AIII can be described by a portion change trigger that is triggered when the gate voltage $U_{Gate}$ is greater than the Miller voltage $U_g(mil)$ and/or when the sens voltage Usens (di/dt), such as the measurement voltage 42 is smaller than the trigger voltage Utrigg,on. The control device is configured to check whether a current change velocity (current rise velocity) occurs. Further, the control device is configured to compare a value of the current change velocity to the trigger voltage. Alternatively, the transition into the portion AIII can also be triggered when the gate voltage is smaller than a (small) trip threshold of the semiconductor-based switch 12.

The activation interval III (portion AIII) can be described such that the same determines the voltage drop velocity $dU_{ce}/dt$. The current $I_C$ can run according to the external load, for example the load impedance 172. The voltage $U_{ce}$ can drop in the region of the static minimum $U_{ce,sat}$. It can be a control target of the respective control device to adjust an edge of the gate voltage $U_{ce}$ that is as steep as possible for reducing the switching losses, but at the same time to obtain a lower interference radiation. A respective circuit configuration can be, for example to adjust the voltage of the controllable activation voltage source, for example the controllable voltage source 16 or 58 in the range of the voltage $U_g(on)$, the static ON-voltage, in order to obtain a great $dU_{ce}/dt$. The voltage $U_g(on)$ can have a value in a range whose bottom limit is greater than the Miller voltage $U_g(mil)$ and whose upper limit is determined by a maximum gate voltage $U_g(on)max$ of the semiconductor-based switch. Further, the control device can be configured to control the controllable resistive circuit such that an ohmic resistance optimized for the portion AIII is effective, for example the resistance k1,1 or k1,2 having the smaller resistance value. This can be performed, for example due to a rising gate collector capacitance $C_{gc}$.

A portion change trigger prior from the activation interval III to the activation interval IV (portion AIV) can be triggered when the gate voltage $U_{Gate}$ is greater or by potencies greater than the Miller voltage $U_g(mil)$ and/or a time interval Δtcon,mil, whose time period can be stored, for example in the timing register 132, has expired. This means that runtime adaptation, for example with different intermediate circuit voltages can be performed. In the activation interval IV (portion IV), the delay time td2,on is significant.

During that time, the voltage $U_{ce}$ drops to a static saturation value $U_{ce,sat}$. A control target of the control device can, for example be a delay time that is as short as possible for reducing switching losses. A respective circuit configuration, can be made, for example such that the voltage of the controllable activation voltage source is set in the range $U_g(on)$. The switch-on resistance Rgon can be performed by a parallel connection of the two resistances k1,1 and k1,2, i.e. a parallel connection of the resistances optimized for the portion AII (Ron di/dt) and AIII (Ron du/dt), respectively.

At the end of the activation interval IV, the semiconductor-based switch is in a static ON-state followed by a deactivation process (for example a switch-off process). For example, during the static ON-state, it can be determined via the sensor 31 by the control device whether a short-circuit current flows through the semiconductor-based switch 12. Such an error case can be transmitted to a superordinate primary control instance by the control device. Alternatively or additionally, the control device can be configured to initiate a switch-off or deactivation sequence.

Alternatively, transition to portion AII, AIII or AIV can be performed when a respective time interval has expired, such as a stored time period with regard to the portion AII (td1, on), a time period of the portion AII, Δtcon, mil or td2,on. If the control device determines that a respective control target of the portion is reached within a control interval, adaptation of the time interval, i.e. extending or reducing the same, can be performed, for example by storing the current values in the timing register. Further, based thereon, transition to the subsequent portion can be performed.

In other words, the Digital Core (control device) represents the intelligent instance of the DCAGDU. The same can be implemented as a complex programmable logic device (CPLD), FPGA, DSP or the like. The main target of the driver (DCAGDU) is, for example the switch-on edge control and switch-off edge control for each operating point that is as optimum as possible in order to keep switching losses as low as possible, to operate the power switch in the secure operating range, to load the complementary freewheeling diode with as little reverse current as possible and to obtain an interference radiation behavior conforming to standards. The DCAGDU can thus implement the approach of portion-by-portion gate control with feedback of the switching state based on the di/dt sensors and controlled tracking of the control parameters.

The basic sequence of this driver unit divides the switch-on phase of the power switch in four portions: in portion A1, maximum driver power is one target in order to minimize switch-on delay time. In portion A2, it is a target to obtain adapted driver power in order to remain in the desired di/dt (current change velocity) for each operating point. In portion AIII, for example, it is a target to obtain high defined driver power in order to obtain the du/dt in the desired range and simultaneously to pass through the Miller plateau as fast as possible for minimizing losses. In portion AIV it is a target to obtain maximum driver power in order to pass through the Tail phase as fast as possible and to obtain static saturation.

Figure 9:
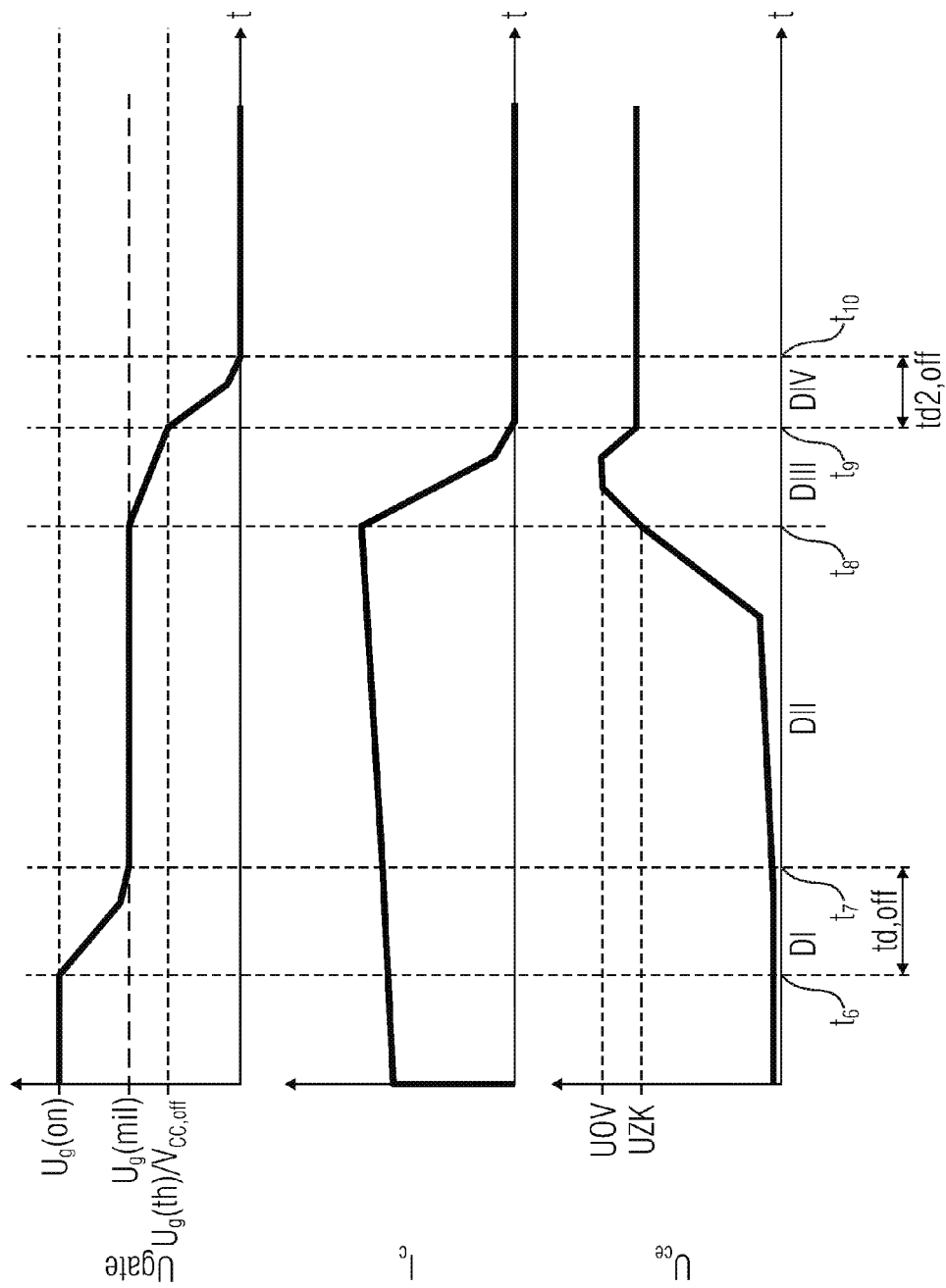
FIG. 9 shows the voltage curves as well as the current curve of FIG. 8 for a deactivation process, for example a switch-off process.
Figure 10:
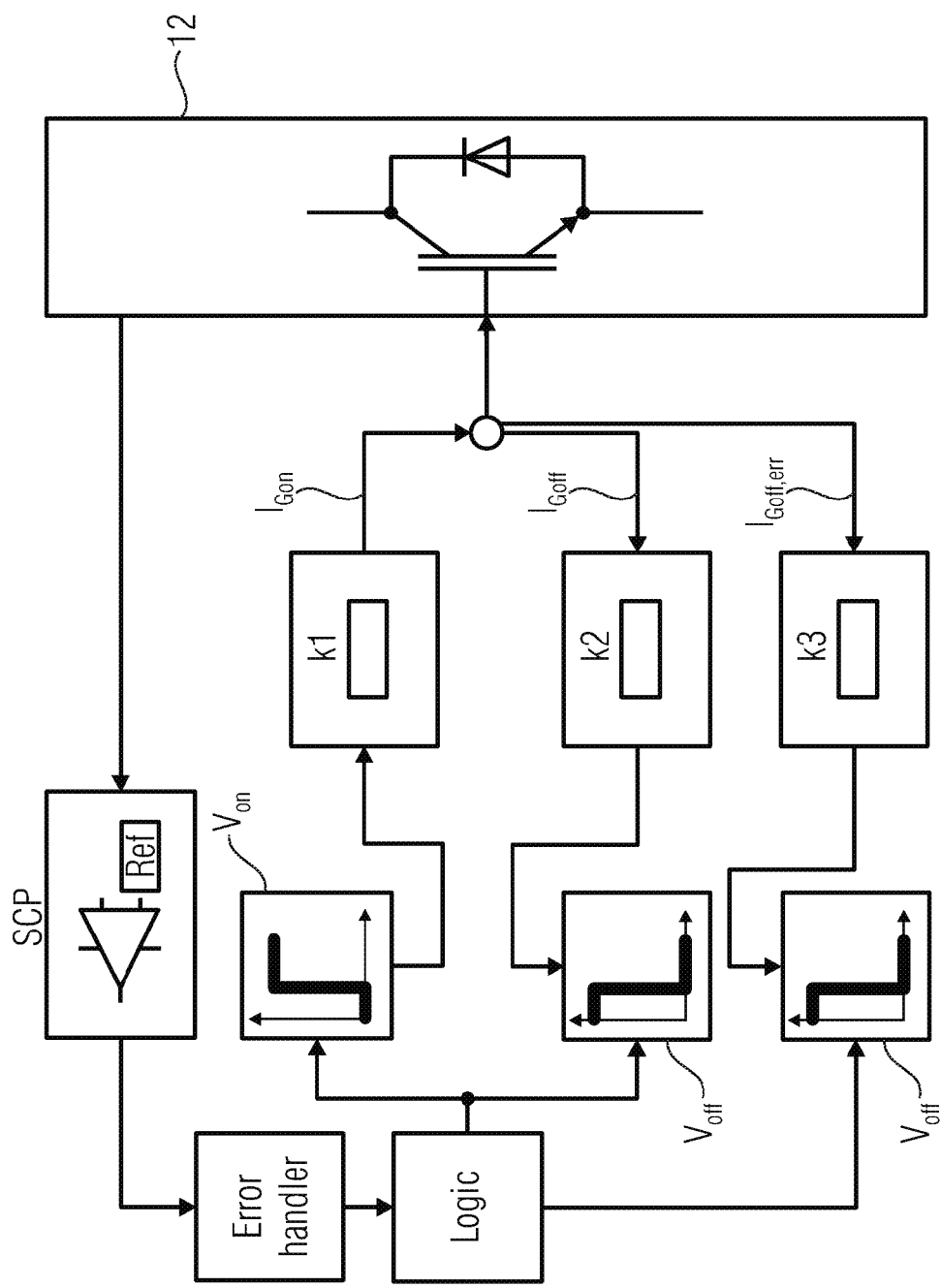
FIG. 10 is a standard topology of a GDU with its functional blocks according to conventional technology.
Figure 11:
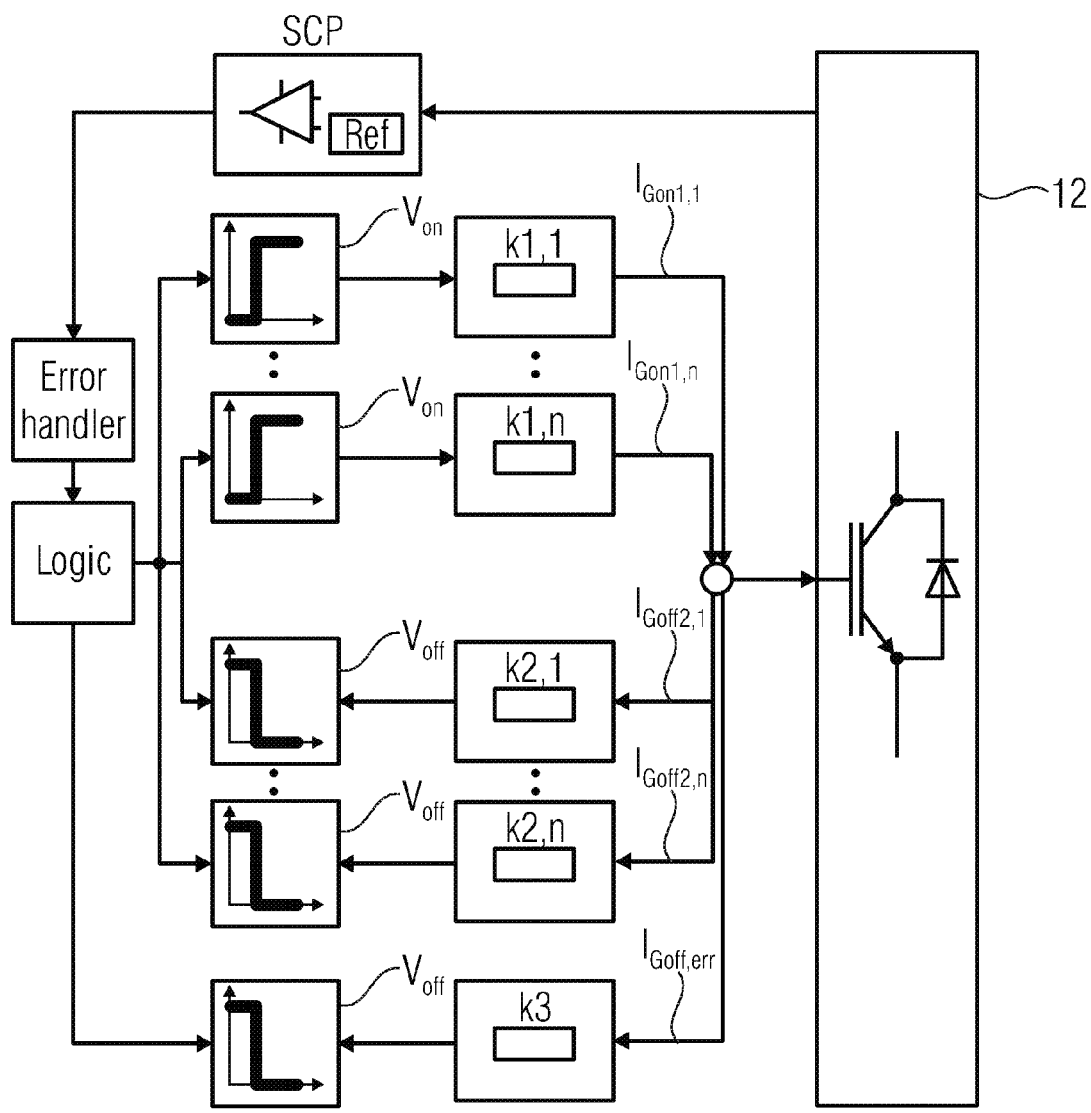
FIG. 11 is a basic structure of a single-stage/multi-stage analog-controlled GDU with an active change of the gate dropping resistor according to conventional technology.
Figure 12:
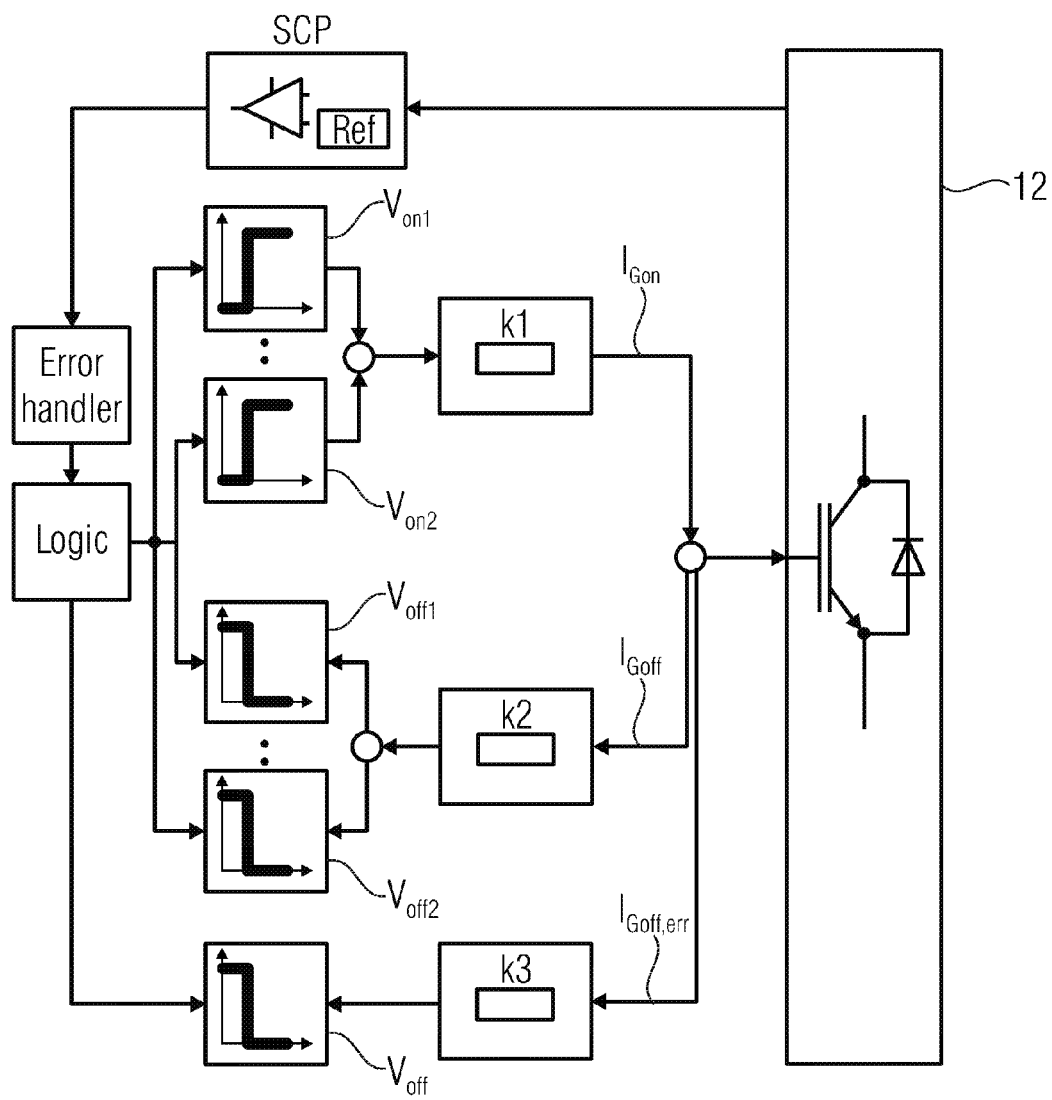
FIG. 12 is a basic structure of a GDU having two voltage levels according to conventional technology.
Figure 13:
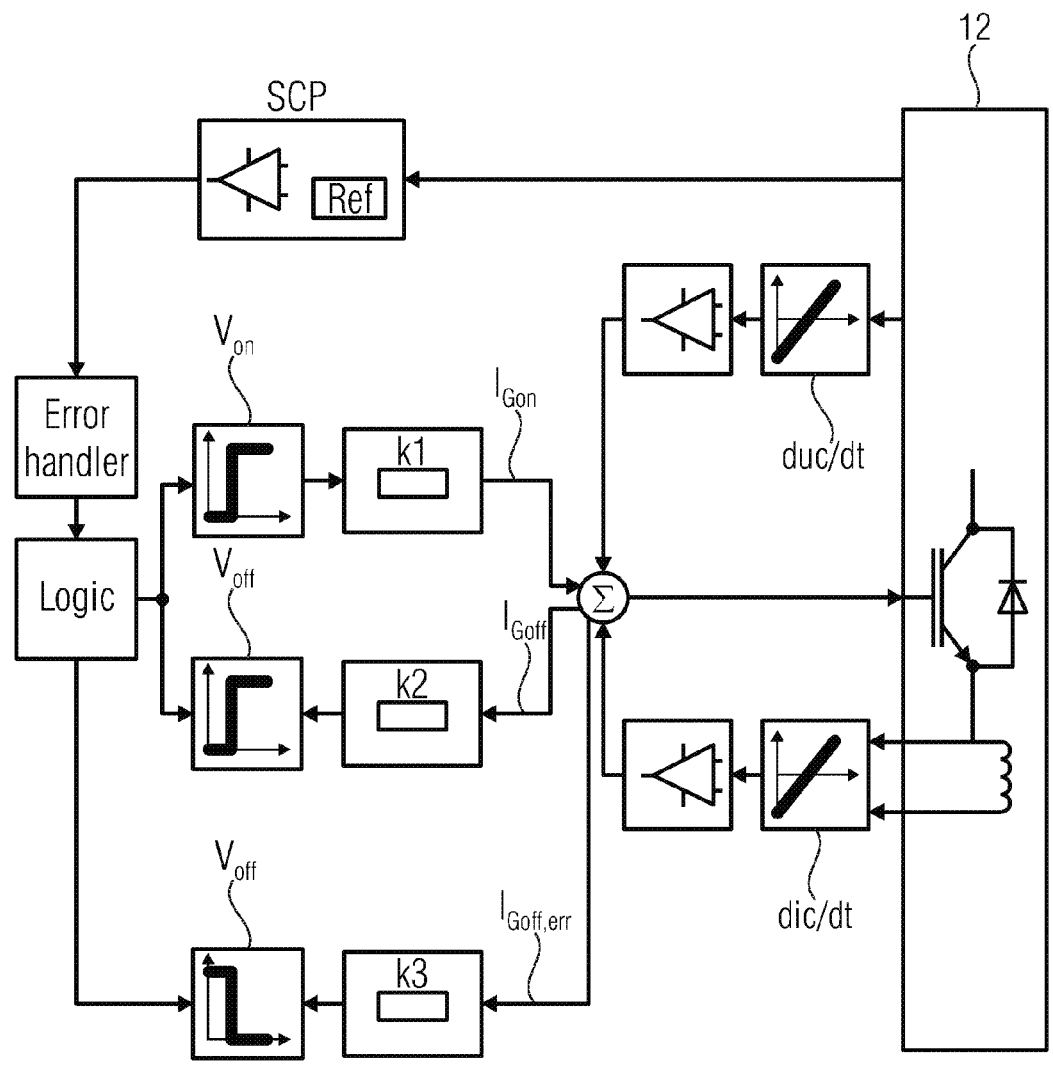
FIG. 13 is the basic structure of an single-stage/multi-stage analog-controlled GDU according to conventional technology.
Figure 14:
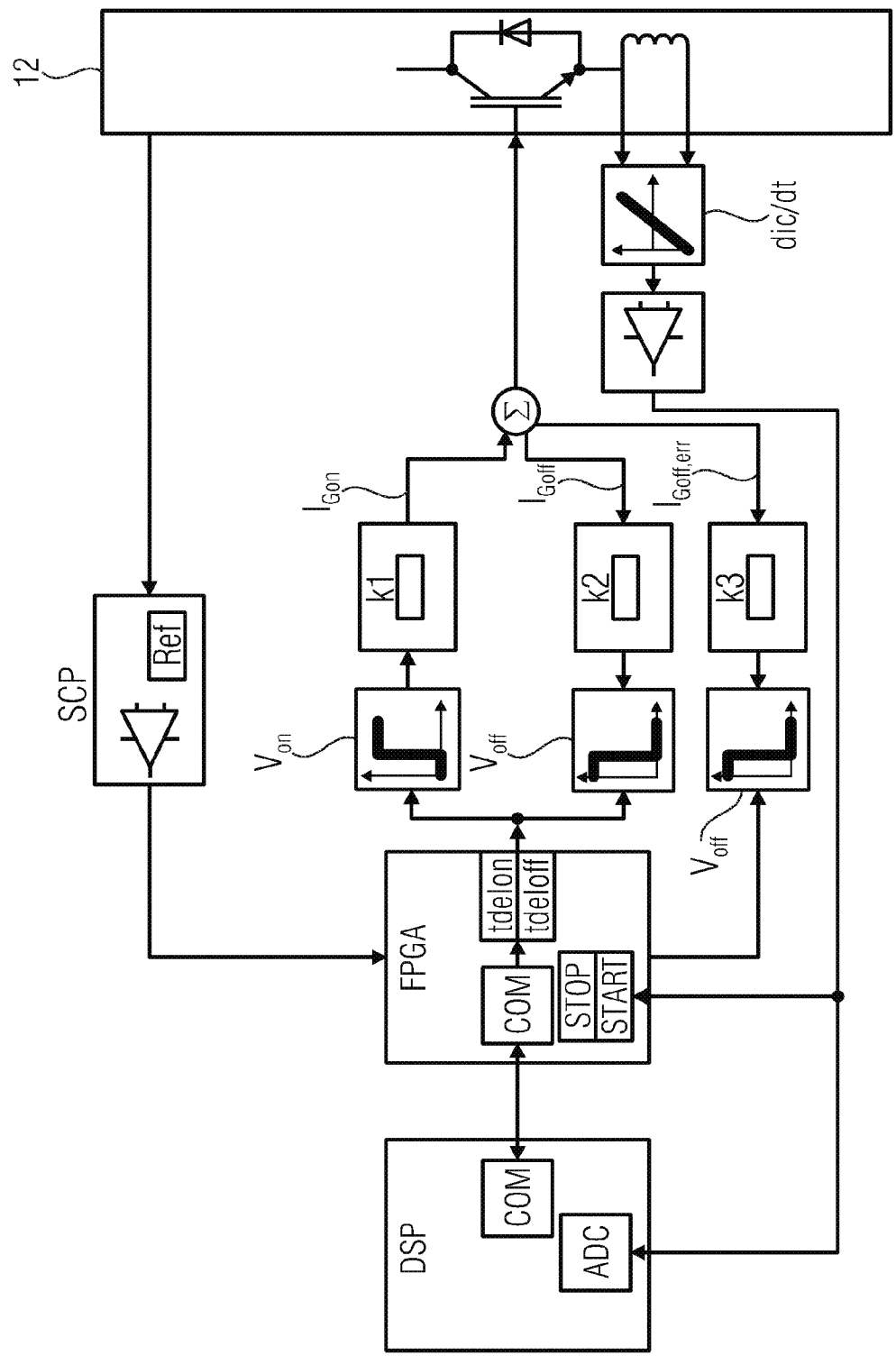
FIG. 14 is an embodiment of a single-stage/multi-stage digital-controlled GDU according to conventional technology.
Figure 15:
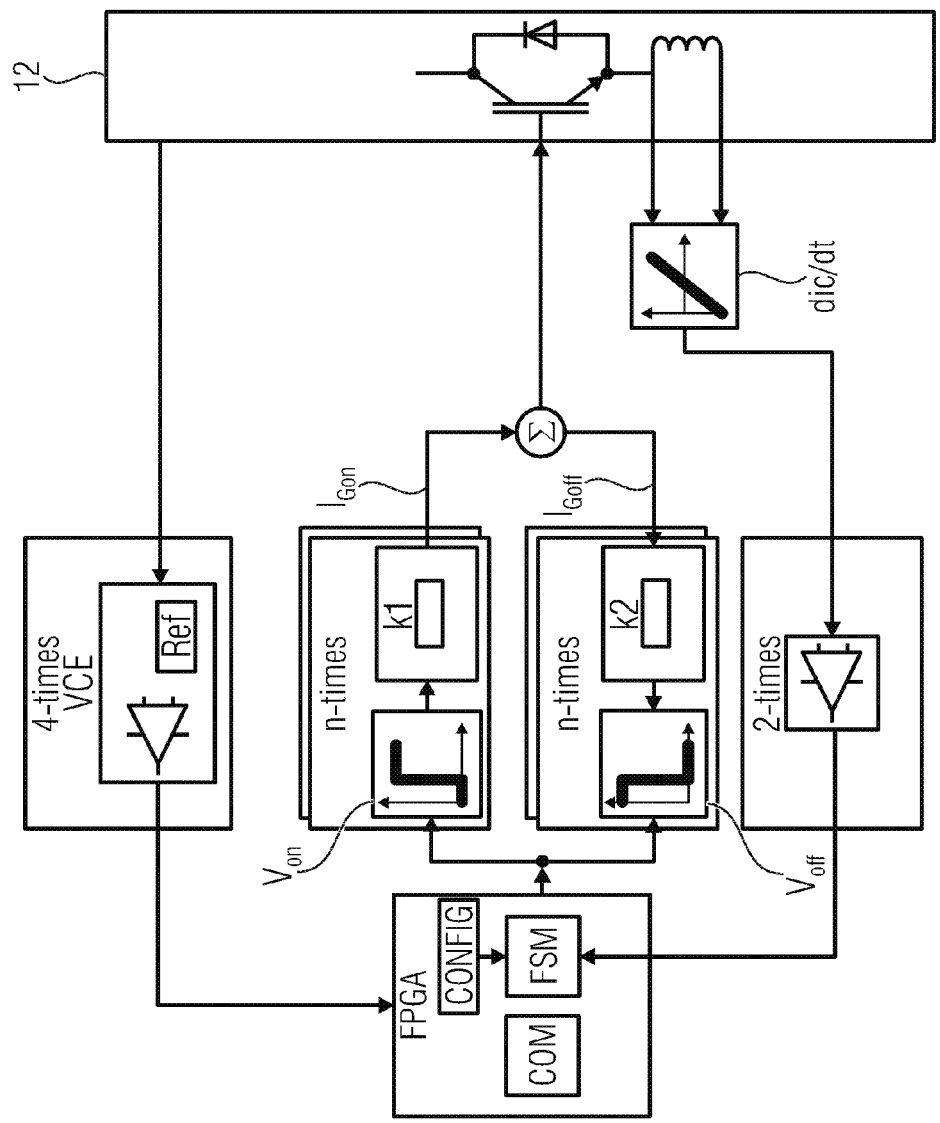
FIG. 15 is a further embodiment of a digital control according to conventional technology.

FIG. 9 shows the voltage curves $U_{Gate}$ and $U_{ce}$ as well as the current curve $I_c$ for a deactivation process, for example a switch-off process that can be arranged prior to the activation process shown in FIG. 8 or, as an alternative, after the same. The time instants $t_6$, $t_7$, $t_8$ and $t_{10}$ are arranged on the time axis in the stated order. The deactivation interval DI is arranged between time intervals $t_6$ and $t_7$. The deactivation interval DII is arranged between time intervals $t_7$ and $t_8$. The deactivation interval DIII is arranged between time intervals $t_8$ and $t_9$. The deactivation interval DIV is arranged between time intervals $t_9$ and $t_{10}$.

The deactivation interval DI (portion DI) represents the delay time td,off. During this interval, voltage $U_{ce}$ and current $I_C$ remain essentially unamended. A possible control target of the respective control device is a delay time that is as short as possible. A respective circuit configuration can, for example, be to adjust the voltage of the controllable deactivation voltage source in the range of the Miller voltage. If the device comprises a controllable resistive circuit in the deactivation path, such as the controllable resistive circuit 82, the respective switch-off resistance Rgoff can be formed of a parallel connection of the ohmic resistances k2,1 and k2,2, wherein one of the resistances k2,1 and k2,2 is optimized for one of the portions DII (Rgoff du/dt) or DIII (Rgoff di/dt). A portion change trigger for transition into the deactivation interval DII can be triggered when the voltage $U_{Gate}$ has approximately dropped into the range of the Miller voltage $U_g(mil)$ and/or a time interval Δtd,off has expired.

The deactivation interval II (portion DII) is determined by the voltage rise velocity $dU_{ce}/dt$. The voltage $U_{ce}$ rises up to a value UZK (intermediate circuit voltage). A target of the control device 56 can be implemented as a plateau retention time that is as short as possible (time in which the voltage Ugate is in the range of the Miller voltage $U_g(mil)$) and a relatively flat edge for reducing the interference radiation and the feedback effects. A respective circuit configuration can be made, for example such that the voltage of the controllable deactivation voltage source is set equal to a voltage $V_{cc,off}$ and the effective output resistance Rgoff du/dt is set and controlled, respectively, to the resistance k2,1 and k2,2 optimized for this portion, for example the one having the smaller resistance value. A portion change trigger for transition into the deactivation interval DIII can be the fulfillment of the condition that the gate voltage $U_{Gate}$ is smaller than the Miller voltage $U_g(mil)$ and/or the sens voltage Usens (di/dt) is smaller than a small, possibly negative, reference or trigger voltage Utrig,off1.

The trigger voltages Utrigg,on and/or Utrigg,off1 can have a low voltage value, which can have, for example 5%, 10% or 15% of the maximum gate voltage. If the device is configured, for example, to bias the control terminal in a negative manner, the trigger voltages Utrigg,on and Utrigg, off1 can also have a negative voltage value.

The deactivation interval 3 (portion DIII) determines the current drop velocity dic/dt. The voltage $U_{ce}$ rises according to the parasitic inductance of the semiconductor-based switch to a switch-off overvoltage value UOV. A target of the respective control device can be to obtain an edge of the voltage $U_{Gate}$ and/or the current $I_c$ that is as steep as possible. Further, a target can be to obtain low interference radiation as well as low switch-off overvoltage at the same time. A possible circuit configuration for obtaining this target can be implemented in that the voltage of the controllable deactivation voltage source is set in the range $U_g(th)$ or a voltage $V_{cc,off}$ in order to obtain decreasing dic/dt. From the resistance effective at first during portion DII, switching to the resistance optimized for the portion DIII can be performed at the beginning of the deactivation interval DIII, such as the one having the greater resistance value, i.e. for example k2,2, such that the same is effective. A portion change trigger for transition into the deactivation interval DIV can be triggered when the voltage $U_g(t)$ is smaller than the threshold voltage $U_g(th)$ and/or the sens voltage Usens (di/dt) is smaller than the positive trigger voltage +Utrig,off. For this, the control device can be configured to check whether a current change velocity (current drop velocity) occurs. Further, the control device is configured to compare a value of the current change velocity to the trigger voltage or another reference voltage.

The deactivation interval DIV (portion IV) determines the delay time td2,off. During this time, the current $I_c$ falls to its static value, for example 0 Ampere, 0.001 Ampere or 0.01 Ampere. One target of the control device can be a delay time that is as short as possible for reducing the switching losses and for preventing renewed switching-on. A possible switching configuration implementing that can be obtained when the voltage of the controllable deactivation voltage source is set to a value $V_{cc,off}$ and/or both switch-off resistances k2,1 and k2,2 are effective, which means a parallel connection of the same is set in the respective controllable resistive circuit.

Alternatively, transition to portion DII, DIII or DIV can take place when a respective time interval has expired, for example a stored time period with regard to td,off, a time period of the portion DII or DIII. If the control device determines that a respective control target of the portion is reached within a control interval, adaptation of the time interval can be performed, for example in that current values are stored in the timing register. Further, based thereon, transition to the subsequent portion can take place. Alternatively, a time period of the portion D1, D2 and/or D3 can also be extended, for example when the control target is not obtained, i.e. extension or reduction of the respective time period can be determined.

Compared to the methods of conventional technology, such a portion change trigger allows intervention in the sequence control based on triggered-based events. This means that contrary to purely time-based controls, the state control of the semiconductor-based switch can be performed based on detected states. This can be implemented as tracked control with direct feedthrough for portion change corrections.

In other words, a target of the deactivation interval 1 (portion DI) is a maximum driver power in order to minimize the switch-off delay time. In a deactivation interval II (portion DII) a target can be a highly-defined driver power in order to keep du/dt in the desired range and at the same time pass through the Miller plateau as fast as possible for minimizing losses. In the deactivation interval III (portion DIII), an adapted driver power can be the target in order to remain within the desired di/dt for each operating point. In the deactivation interval IV (portion DIV), a maximum driver power can be a target in order to pass through the tail phase as fast as possible to reach the secure OFF state. This means that also the switch-off phase can be divided into four portions.

Recycling the charge carriers received from the control terminal according to the second aspect can be performed, for example, up to the end of the third portion DIII. Alternatively, switching to the static OFF-voltage can also be performed at another time, for example during the third portion DIII. This can result in reaching the static OFF-control voltage faster by reducing a concentration of the recycled charge carriers. In other words, a change between source voltage VCC and static OFF-voltage VEE can result, during the portion DIII, in an accelerated fading-off or the control limit for the maximum current steepness can basically be increased. A change at the beginning or within the portion DIV results in softer fading-off and an increased portion of restored energy.

The above-described devices and/or control methods are suitable for regulated control of MOSFETs and IGBTs in hard-switching applications in 2-level or multi-level-topologies. Basically, all possible module packages as well as customized and/or application-specific structure versions can be used. All voltage classes of a few 100 volts up to high-volt (HV) applications, for example in a range of more than 3.3 kV, more than 4.5 kV or more can be addressed. The solution is also suitable for fast switching applications.

The presented implementation options describe a functional unit of a digital control core, which optimally controls, with the help of a di/dt sensor as feedback path, the switch-on and switch-off edge of a power switch for each operating point at runtime. This can be performed, for example, with at least one resistive switch-on path combined with at least one adjustable voltage source as well as with at least one resistive switch-off path in combination with at least one adjustable voltage source/sink. In embodiments, the information from the di/dt sensor serves to adapt the runtimes, control of the switching paths and regulation of the adjustable voltage sources/sinks. Further, embodiments provide simultaneous control option of the switch-off edge and feedback of the control energy when switching off the semiconductor-based switch in a generally used auxiliary energy source of the GDU. This can be realized with at least one adjustable resistive switch-off path in combination with at least one stationary auxiliary energy source.

Further, the above embodiments according to the third aspect describe a realization of the di/dt sensor. The same is embodied in a specific implementation option. Further, a dynamic gate voltage inverse feedback is described as protection against undesired (renewed) switching-on due to Miller-induced feedback of voltage changes at the power switch. Such a realization can be provided by detecting the voltage difference between set value of the gate voltage and actual value of the gate voltage at the power switch and can be provided to an active switch as inverse feedback path for reducing the actual value.

Although some aspects have been described in the context of an apparatus, it is clear that these aspects also represent a description of the corresponding method, such that a block or device of an apparatus also corresponds to a respective method step or a feature of a method step. Analogously, aspects described in the context of a method step also represent a description of a corresponding block or item or feature of a corresponding apparatus.

Depending on certain implementation requirements, embodiments of the invention can be implemented in hardware or in software. The implementation can be performed using a digital storage medium, for example a floppy disk, a DVD, a Blu-Ray disc, a CD, an ROM, a PROM, an EPROM, an EEPROM or a FLASH memory, a hard drive or another magnetic or optical memory having electronically readable control signals stored thereon, which cooperate or are capable of cooperating with a programmable computer system such that the respective method is performed. Therefore, the digital storage medium may be computer readable. Some embodiments according to the invention include a data carrier comprising electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, wherein the computer program is stored on a machine readable carrier.

In other words, an embodiment of the inventive method is, therefore, a computer program comprising a program code for performing one of the methods described herein, when the computer program runs on a computer. A further embodiment of the inventive methods is, therefore, a data carrier (or a digital storage medium or a computer-readable medium) comprising, recorded thereon, the computer program for performing one of the methods described herein.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

In some embodiments, a programmable logic device (for example a field programmable gate array, FPGA) may be used to perform some or all of the functionalities of the methods described herein. In some embodiments, a field programmable gate array may cooperate with a microprocessor in order to perform one of the methods described herein. Generally, the methods are performed by any hardware device. This can be a universally applicable hardware, such as a computer processor (CPU) or hardware specific for the method, such as ASIC.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. Device for switching a semiconductor-based switch, comprising:
a terminal configured to be connected to a control terminal of the semiconductor-based switch;
a controllable activation voltage source configured to provide a time-varying activation voltage potential;
a controllable resistive circuit comprising at least two ohmic resistances connected in parallel, which are controllable so that at least three resistance values of the parallel connection result; and
a control device configured to control the controllable activation voltage source and the controllable resistive circuit independently of one another;
wherein the controllable activation voltage source and the controllable resistive circuit are connected in a series connection that is connected to the terminal; and
wherein the control device is configured to control the controllable activation voltage source and the controllable resistive circuit in a time-varying manner in order to acquire time-varying resistance values of the controllable resistive circuit and the time-varying activation voltage potential of the controllable activation voltage source, so that a time-varying voltage potential based on the time-varying resistance values and the time-varying activation voltage potential is applied to the control terminal;
wherein the controllable activation voltage source comprises a first circuit path connected to a source potential and comprising a first controllable switch, and a second circuit path connected to an adjustable voltage potential and comprising a second controllable switch, wherein the first circuit path and the second circuit path are connected to one another at a circuit node at an end facing away from the source potential and the adjustable voltage potential, wherein the circuit node is connected to the controllable resistive circuit, so that based on a position of the first and second controllable switches the adjustable voltage potential or the source potential can be applied to the controllable resistive circuit.

2. Device according to claim 1, wherein the controllable activation voltage source is a digitally adjustable voltage regulator, wherein the source voltage is an operating voltage of the device and wherein the voltage regulator is configured to control the adjustable voltage potential gradually between a minimum value and the source potential.

3. Device according to claim 2, wherein the minimum value is a threshold voltage of the semiconductor-based switch or a control potential of the semiconductor-based switch, which enables an active state of the semiconductor-based switch.

4. Device according to claim 1, wherein the control device is configured to place the first controllable switch and the second controllable switch simultaneously in an open state, so that current flow from the controllable activation voltage source to the terminal is prevented.

5. Device according to claim 1, wherein the control device is configured to convert, during an activation phase, the semiconductor-based switch from the first switching state to the second switching state and to connect, during the activation phase, the controllable resistive circuit to the adjustable voltage potential and to connect, during a time interval preceding the activation phase, the source potential to the controllable resistive circuit.

6. Device according to claim 1, wherein the control device is configured to acquire, in intervals, in a preceding control time interval, a comparative result based on a comparison of a current change velocity of a power current flowing through the semiconductor-based switch with a comparative value, and to adjust the controllable activation voltage source based on the comparative result for a control time interval following the preceding control time interval, so that the time-varying voltage potential is increased when the comparative result is less than a predefined lower limit and that the time-varying voltage potential is reduced when the comparative result is greater than a predefined upper limit.

7. Device according to claim 1, wherein the control device comprises a digital control that is configured to control the controllable resistive circuit and the controllable activation voltage source for a current control time interval based on a comparison of set values of a current change velocity of a power current flowing through the semiconductor-based switch and a control current flowing to or away from the control terminal of the semiconductor-based switch with measurement values of the current change velocity of the power current, wherein the set values are valid for a current control time interval, wherein the set values are derived from actual values of a preceding control time interval and wherein the digital control is configured to determine, based on the comparison, an amended time period of a time interval for the current control time interval.

8. Device according to claim 1, further comprising a controllable deactivation voltage source connected to the terminal and configured to provide, at least temporarily, a switching potential, wherein the switching potential is galvanically coupled to a supply potential of the control device and has a lower potential value than a threshold voltage of the semiconductor-based switch and wherein the control device is configured to control the controllable deactivation voltage source so that, based on the provided switching potential, charge carriers stored in a control capacitance of the semiconductor-based switch flow out of the control capacitance and contribute to an operation of the control device based on the galvanic coupling.

9. Device according to claim 1, further comprising a sensor for detecting a current change velocity of a power current flowing through the semiconductor-based switch, the sensor comprising:
- an insulating foil configured to be connected to the first or second terminal of the semiconductor-based switch; and
- an inductance arranged on the insulating foil on a side of the same that is arranged opposite to a side facing the semiconductor-based switch during a measurement operation of the sensor in order to detect a magnetic field generated by the power current and to provide a measurement voltage based on the detected magnetic field;
- wherein the inductance is spaced apart from the semiconductor-based switch during the measurement operation at least by the insulating foil, so that contactless measurement of the current change velocity by the sensor is enabled;
- wherein the insulating foil further comprises a mounting portion; and
- wherein the first or second terminal of the semiconductor-based switch is connected to the mounting portion of the insulating foil.

10. Device according to claim 1, further comprising an inverse feedback branch that is configured to connect, based on a current rise velocity of a power current flowing through the semi-conductor based switch, the terminal to a static OFF-voltage, so that current flowing from the terminal to the control terminal of the semi-conductor based switch is reduced, wherein the inverse feedback branch is configured to be effective when the current rise velocity reaches or exceeds a predefined threshold.

11. Device according to claim 9, wherein the inverse feedback branch comprises a transistor and wherein the current rise velocity is represented as a measurement signal of a sensor connected to the transistor at a control input of the transistor.

12. Device according to claim 1, further comprising:
- a controllable deactivation voltage source connected to the terminal and configured to provide, at least temporarily, a switching potential at a potential node;
- a further controllable resistive circuit comprising at least two ohmic resistances connected in parallel that are controllable so that at least three resistance values of the parallel connection result; and
- wherein the control device is configured to control the controllable deactivation voltage source and the further controllable resistive circuit independently of one another in a time-varying manner;
- wherein the controllable deactivation voltage source and the further controllable resistive circuit are connected into a further series connection;
- wherein the series connection and the further series connection are connected in series with one another, wherein a circuit node between the series connection and the further series connection is connected to the terminal; and
- wherein the control device is configured to control the controllable deactivation voltage source and the further controllable resistive circuit in a time-varying manner to acquire time-varying resistive values of the further controllable resistive circuit and a time-varying voltage of the controllable deactivation voltage source, so that a time-varying voltage potential based on the time-varying resistance values and the time-varying voltage is applied to the control terminal;
- wherein the semiconductor-based switch comprises a first switching state when a control voltage at the control terminal has a value that is greater than or equal to a voltage of a Miller plateau and a second switching state when the control potential is less than a threshold voltage.

13. Device according to claim 12, wherein the control device is configured to control the controllable deactivation voltage source, the controllable activation voltage source, the controllable resistive circuit and the further controllable resistive circuit in a time-varying manner and independently of one another in order to convert, during an activation phase, the semiconductor-based switch from the second switching state into the first switching state and, during a deactivation phase, from the first switching state to the second switching state,
- wherein the activation phase comprises a first activation time interval, a second activation time interval, a third activation time interval and a fourth activation time interval that are arranged successively in time in the stated order;
- wherein the deactivation phase comprises a first deactivation time interval, a second deactivation time interval, a third deactivation time interval and a fourth deactivation time interval that are arranged successively in time in the stated order;
- wherein the control device is configured to provide, during the activation phase, a current flow from the controllable activation voltage source towards the control terminal to provide, during the deactivation phase, a current flow from the control terminal towards the controllable deactivation voltage source;
- wherein the control device is configured
  - to control, during the first activation time interval, the controllable resistive circuit so that a first ohmic resistance comprising a first resistance value and a second ohmic resistance comprising a second resistance value and being connected in parallel to the first ohmic resistance are effective;
  - to control, during the second activation time interval, the controllable resistive circuit so that the first ohmic resistance is effective and the second ohmic resistance is ineffective; to control, during the third activation time interval, the controllable resistive circuit so that the first ohmic resistance is ineffective and the second ohmic resistance is effective;
  - to control, during the fourth activation time interval, the controllable resistive circuit so that the first and the second ohmic resistances are effective; and
- wherein the first resistance value differs from the second resistance value;

wherein the control device is configured
- to control, during the first deactivation time interval, the further controllable resistive circuit so that a third ohmic resistance comprising a third resistance value and a fourth ohmic resistance comprising a fourth resistance value and being connected in parallel to the third ohmic resistance are effective;
- to control, during the second deactivation time interval, the further controllable resistive circuit so that the third ohmic resistance is effective and the fourth ohmic resistance is ineffective;
- to control, during the third deactivation time interval, the further controllable resistive circuit so that the third ohmic resistance is ineffective and the fourth ohmic resistance is effective;
- to control, during the fourth deactivation time interval, the further controllable resistive circuit so that the third and the fourth ohmic resistances are effective; and wherein the third resistance value differs from the fourth resistance value.

14. Device according to claim 1, wherein a controllable ground switch is connected between the terminal and the controllable deactivation voltage source, which is configured to connect the terminal to a reference potential when the controllable ground switch is controlled in a conductive state, so that an increase of charge carriers stored in the control capacitance of the semiconductor-based switch is prevented, wherein the control device is configured to control the controllable ground switch and wherein the control device is configured to at least indirectly determine a control voltage that is applied between the control terminal of the semiconductor-based switch and a further terminal of the semiconductor-based switch and to control the controllable ground switch when the control voltage is less than a switch-off voltage of the semiconductor-based switch.

* * * * *